(12) United States Patent
Bashir et al.

(10) Patent No.: US 10,594,336 B2
(45) Date of Patent: Mar. 17, 2020

(54) INJECTION LOCKED TIME MODE ANALOG TO DIGITAL CONVERTER

(71) Applicant: University College Dublin, Dublin (IE)

(72) Inventors: Imran Bashir, Santa Barbara, CA (US); Robert B. Staszewski, Dublin (IE); Filippo Schembari, Dublin (IE)

(73) Assignee: University College Dublin, Dublin (IE)

( * ) Notice: Subject to any disclaimer, the term of this patent is extended or adjusted under 35 U.S.C. 154(b) by 121 days.

(21) Appl. No.: 15/765,627

(22) PCT Filed: Oct. 6, 2016

(86) PCT No.: PCT/US2016/055836
§ 371 (c)(1),
(2) Date: Feb. 6, 2019

(87) PCT Pub. No.: WO2017/062679
PCT Pub. Date: Apr. 13, 2017

(65) Prior Publication Data
US 2019/0280709 A1    Sep. 12, 2019

Related U.S. Application Data

(60) Provisional application No. 62/238,371, filed on Oct. 7, 2015.

(51) Int. Cl.
*H03M 3/00* (2006.01)
*H03K 3/03* (2006.01)
(Continued)

(52) U.S. Cl.
CPC .......... *H03M 3/458* (2013.01); *H03K 3/0315* (2013.01); *H03M 1/1033* (2013.01); *H03M 1/60* (2013.01)

(58) Field of Classification Search
CPC .............................. H03K 3/0315; H03M 3/458
(Continued)

(56) References Cited

U.S. PATENT DOCUMENTS

| 6,580,330 B1 * | 6/2003 | Katznelson | H03L 7/24 331/177 R |
| 6,995,846 B2 * | 2/2006 | Kalayeh | G01N 21/39 356/437 |

(Continued)

OTHER PUBLICATIONS

Lee, K., et al., "A 10MHz-BW, 5.6mW, 70dB SNDR ΔΣ ADC using VCO-based integrators with intrinsic DEM", IEEE International Symposium on Circuits and Systems (ISCAS), pp. 2006-2009, May 31, 2013.

(Continued)

*Primary Examiner* — Lam T Mai
(74) *Attorney, Agent, or Firm* — Zaretsky Group PC; Howard Zaretsky

(57) ABSTRACT

A novel and useful time mode analog to digital converter (ADC) that employs injection locking to overcome the nonlinearities of the voltage controlled oscillator (VCO). The oscillator's frequency is modulated using injection locking rather than varying its supply voltage. The oscillator is injection locked with a vector modulated signal, the frequency of which is derived from the oscillator itself. The output of the oscillator is modulated by the input voltage $V_{in}(t)$. The output of the modulator is at the same frequency as the oscillator with an envelope (i.e. amplitude) determined by $V_{in}(t)$. This signal is injected back into the oscillator at one or more points. The frequency of the oscillator $\omega_{out}(t)$ changes in order to satisfy the Barkhausen criteria for oscillation. Alternatively, each stage of a ring oscillator (RO) incorporates its own mixer (i.e. modulator) and a vector modulated signal is injected into all stages of the RO simultaneously yielding uniform phase resolution (Continued)

across the RO, enhancement of the VCO gain, and improved figure of merit (FoM).

24 Claims, 18 Drawing Sheets

(51) Int. Cl.
*H03M 1/10* (2006.01)
*H03M 1/60* (2006.01)

(58) Field of Classification Search
USPC .................................................. 341/125–155
See application file for complete search history.

(56) References Cited

U.S. PATENT DOCUMENTS

| | | | | |
|---|---|---|---|---|
| 9,588,497 | B1* | 3/2017 | Monk | G04F 10/005 |
| 9,705,521 | B1* | 7/2017 | Monk | H03M 1/66 |
| 2008/0284635 | A1 | 11/2008 | Blatz et al. | |
| 2011/0110439 | A1* | 5/2011 | Miyaoka | H04B 1/0475 375/259 |
| 2012/0020677 | A1* | 1/2012 | Noguchi | H03L 7/0816 398/202 |
| 2012/0154192 | A1 | 6/2012 | Op | |
| 2013/0141143 | A1* | 6/2013 | Sato | H03L 7/16 327/141 |
| 2013/0143509 | A1* | 6/2013 | Horng | H04B 1/0039 455/269 |
| 2014/0079098 | A1* | 3/2014 | Harjani | H04B 1/001 375/219 |
| 2014/0369323 | A1* | 12/2014 | Grankin | H03L 7/00 370/336 |
| 2016/0336944 | A1* | 11/2016 | Nakai | H03L 7/095 |

OTHER PUBLICATIONS

Saniei, N., et al., "A high speed SiGe VCO based on self injection locking scheme", Iranian Journal of Science and Technology, vol. 31, No. B6, pp. 641-650, Dec. 31, 2007.
McNeill, J.A., "Split ADC" background linearization of VCO-based ADCs. IEEE Transactions on Circuits and Systems I: Regular Papers, vol. 62, Issue 1, pp. 49-58, Oct. 24, 2014.
Melville, R., et al., "An injection locking scheme for precision quadrature generation", IEEE Solid-State Circuits Conference ESSCIRC 2001. pp. 17-20, Sep. 3, 2001.
Gosh, A. et al., "Linearization Through Dithering: A 50 MHz Bandwidth, 10-b ENOB, 8.2 mW VCO-Based ADC," IEEE JSSC, vol. 50, No. 9, pp. 2012-2024, Sep. 2015.
Reddy, K. et al., "A 16-mW 78-dB SNDR 10-MHz BW CT ADC using residue-cancelling VCO-based quantizer," IEEE JSSC, vol. 47, No. 12, pp. 2916-2927, Dec. 2012.
Yoon, Y. et al., "A time-based bandpass ADC using time-interleaved voltage-controlled oscillators," IEEE TCAS I, Reg. Papers, vol. 55, No. 11, pp. 3571-3581, Dec. 2008.
Si,R. et al., "A 100MHz S/s, 7 bit VCO-based ADC which is used in Time Interleaved ADC Architectures," 2nd International Conference on Consumer Electronics, Communications and Networks (CECNet), pp. 4-7, Apr. 2012.
Iwata, A. et al., "The architecture of delta sigma analog-to-digital converters using a voltage-controlled oscillator as a multi-bit quantizer," IEEE Trans. Circuits Syst. II, vol. 46, No. 7, pp. 941-945, Jul. 1999.
Straayer, M. et al., "A 12-bit 10-MHz bandwidth, continuous time sigma-delta ADC with a 5-bit, 950-MS/S VCO-based quantizer," IEEE J.Solid-State Circuits, No. 4, pp. 805-814, Apr. 2008.
Taylor, G. et al., "A mostly-digital variable-rate continuous-time Delta-Sigma modulator ADC," IEEE Journal of, vol. 45, No. 12, pp. 2634-2646, 2010.
Rao, S. et al., "A deterministic digital background calibration technique for VCO-based ADCs," IEEE J. Solid-State Circuits, vol. 49, No. 4, pp. 950-960, Apr. 2014.
Naiknaware, R. et al., "Time-referenced single-path multi-bit ΣΔ ADC using a VCO-based quantizer," IEEE Trans. Circuits Syst. II, Analog Digit. Signal Process., vol. 47, No. 6, pp. 596-602, Jun. 2000.
El-Halwagy, W., "A programmable 8-bit, 10MHz BW, 6.8mW, 200MSample/sec, 70dB SNDR VCO-based ADC using SC feedback for VCO linearization," IEEE (ICECS), 2013.
Zaliasl, S. et al., and T. S. Fiez, "A 12.5-bit 4 MHz 13.8 mW MASH modulator with multirated VCO-based ADC," IEEE TCAS I, vol. 59, No. 8, pp. 1604-1613, Aug. 2012.
Park, M. et al., "A 78 dB SNDR 87 mW 20 MHz bandwidth continuous-time ADC with VCO-based integrator and quantizer implemented in 0.13 m CMOS," IEEE JSSC, vol. 44, No. 12, pp. 3344-3358, Dec. 2009.
Staszewski, R.B. et al., "All-digital PLL and transmitter for mobile phones," IEEE JSSC, vol. 40, No. 12, pp. 2469-2482, Dec. 2005.
Kim, J. et al., "Analysis and design of voltage-controlled oscillator based analog-to-digital converter," IEEE Trans. Circuits Syst. I, vol. 57, No. 1, pp. 18-30, Jan. 2010.
Xing, X. et al., "A 42 fJ/Step-FoM Two-Step VCO-Based Delta-Sigma ADC in 40 nm CMOS," IEEE J. Solid-State Circuits, vol. 50, No. 3, pp. 714-723, Dec. 2015.
Hoven, M. et al., "Delta-Sigma Modulators Using Frequency-Modulated Intermediate Values," IEEE J. Solid-State Circuits, vol. 32, No. 11, pp. 13-22, Jan. 1997.
Gupta, A. et al., "A two-stage ADC architecture with VCO-based second stage," IEEE Trans. Circuits Syst. II, Exp. Briefs, vol. 58, No. 11, pp. 734-738, Nov. 2011.
Wismar, U. et al., "A 0.2 V 0.44 µW 20 kHz Analog to Digital ΣΔ Modulator with 57 fJ/conversion FoM," Proc. of the ESSCIRC, pp. 187-190, Sep. 2006.
Cui, S. et al., "A Highly Linear CMOS Current-Controlled Oscillator Using a Novel Frequency Detector," IEEE ISCAS, pp. 2841-2844, May 2008.
Hor, H. C. et al., "Review on VCO based ADC in Modern Deep Submicron CMOS Technology," IEEE International Symposium on RFIT, 2012.
International Search Report PCT/ISA/210 dated Feb. 2, 2017, International Application PCT/US2016/055836.

* cited by examiner

US 10,594,336 B2

INJECTION LOCKED TIME MODE ANALOG TO DIGITAL CONVERTER

FIELD OF THE INVENTION

The present invention relates generally to analog to digital converter circuits and in particular to an injection locked time mode analog to digital converter.

BACKGROUND OF THE INVENTION

Analog to digital converters are well known circuits in the electronics arts. In electronics, an analog to digital converter (ADC) is a system that converts an analog signal into a digital signal. The analog signal is typically a voltage domain signal but it could be a current or charge domain signal. A digital-to-analog converter (DAC) performs the reverse function. An ADC may also provide an isolated measurement such as an electronic device that converts an input analog voltage or current to a digital number proportional to the magnitude of the voltage or current.

The conversion involves quantization of the input, so it necessarily introduces a small amount of error. Furthermore, instead of continuously performing the conversion, an ADC does the conversion periodically, sampling the input. The result is a sequence of digital values that have been converted from a continuous-time and continuous-amplitude analog signal to a discrete-time and discrete-amplitude digital signal. Note that sometimes the provided input is discrete in time through, for example, a circuit called "sample-and-hold".

An ADC is defined by its bandwidth and its signal-to-noise ratio. The bandwidth of an ADC is characterized primarily by its sampling rate. The dynamic range of an ADC is influenced by many factors, including the resolution, linearity and accuracy (i.e. how well the quantization levels match the true analog signal), aliasing and jitter. The dynamic range of an ADC is often summarized in terms of its effective number of bits (ENOB), i.e. the number of bits of each measure it returns that are on average not noise. An ideal ADC has an ENOB equal to its resolution. ADCs are chosen to match the bandwidth and required signal-to-noise ratio of the signal to be quantized. If an ADC operates at a sampling rate greater than twice the bandwidth of the signal, then perfect reconstruction is possible given an ideal ADC and neglecting quantization error. The presence of quantization error limits the dynamic range of even an ideal ADC. If the dynamic range of the ADC exceeds that of the input signal, however, its effects may be neglected resulting in an essentially perfect digital representation of the input signal.

A time mode analog to digital converter is a special type of ADC that utilizes a voltage to frequency converter to convert the input voltage signal into an oscillating signal with a frequency proportional to the voltage of the input signal. A frequency counter is then used to convert that frequency into a digital count proportional to the input signal voltage. Longer integration times allow for higher resolutions. Likewise, the speed of the converter can be improved by sacrificing resolution. The two parts of the time mode ADC may be widely separated, with the frequency signal passing through an optoisolator or transmitted wirelessly. Some such ADCs use sine wave or square wave frequency modulation while others use pulse frequency modulation.

The transfer function of the voltage to frequency converter used in traditional time mode ADCs, however, suffers from relatively nonlinear response over a fairly wide frequency tuning range. This impacts the linearity and dynamic range of the ADC. There is thus a need for a time mode ADC that incorporates a voltage to frequency converter that exhibits fairly linear response over a wide frequency tuning range in which the linearity and dynamic range of the ADC are significantly improved.

SUMMARY OF THE INVENTION

The present invention is a time mode analog to digital converter (ADC) that employs injection locking to overcome the nonlinearities of the voltage controlled oscillator (VCO). The oscillator's frequency is modulated using injection locking rather than varying its supply voltage. The oscillator is injection locked with a vector modulated signal, the frequency of which is derived from the oscillator itself. The output of the oscillator is modulated by the input voltage $V_{in}(t)$. The output of the modulator is at the same frequency as the oscillator with an envelope (i.e. amplitude) determined by $V_{in}(t)$. This signal is injected back into the oscillator at one or more points. The frequency of the oscillator $\omega_{out}(t)$ changes in order to satisfy the Barkhausen criteria for oscillation. Alternatively, each stage of a ring oscillator (RO) incorporates its own mixer (i.e. modulator) and a vector modulated signal is injected into all stages of the RO simultaneously yielding uniform phase resolution across the RO, enhancement of the VCO gain, and improved figure of merit (FoM).

In some embodiments of the time mode ADC, the input voltage is applied to the VCO bias. In this manner, the period of the VCO is a linear function of the input voltage. The VCO frequency, however, is inversely proportional to the input voltage. Therefore, the spurious free dynamic range (SFDR) and effective number of bits (ENOB) of the ADC is limited.

As an improvement, several time mode ADC embodiments are provided that incorporate an injection locked oscillator where the VCO frequency is proportional to the input signal. Therefore, these embodiments achieve SFDR and ENOB almost as good as closed loop ADC configurations while maintaining the efficiency of an open loop configuration.

There is thus provided in accordance with the invention, a time mode analog to digital converter (ADC) circuit, comprising an oscillator operative to generate an oscillator signal, a modulator operative to generate a vector modulated signal in accordance with an input signal and the oscillator signal, wherein the vector modulated signal is injected back into the oscillator whose frequency of oscillation is determined by the input signal, and a phase converter operative to generate a digital output substantially proportional to the input signal in accordance with the oscillator signal.

There is also provided in accordance with the invention, a method of time mode analog to digital conversion, the method comprising providing an oscillator operative to generate an oscillator signal, modulating the oscillator signal in accordance with an input signal to generate a vector modulated signal, injecting the vector modulated signal back into the oscillator whose frequency of oscillation is determined by the input signal, and converting a phase of the oscillator signal to generate a digital output therefrom substantially proportional to the input signal.

There is further provided in accordance with the invention, a time mode analog to digital converter (ADC) circuit, comprising a free running N-stage ring oscillator, each stage comprising a load circuit operative to generate a respective oscillator signal, a mixer coupled to the load circuit and operative to mix an input signal with an oscillator signal from a stage other than its own to generate a respective vector modulated signal therefrom, wherein the vector modulated signal in each stage is simultaneously injected into a respective load circuit thereof, wherein a frequency of oscillation of the oscillator is determined by the input signal, a phase converter operative to generate a digital output substantially proportional to the input signal in accordance with at least one of the oscillator signals, and wherein N is an integer greater than or equal to two.

There is also provided in accordance with the invention, a method of time mode analog to digital conversion, the method comprising providing a free running N-stage ring oscillator, each stage including a load circuit, the oscillator operative to generate a respective oscillator signal at each stage thereof, at each stage of the ring oscillator, mixing an input signal with an oscillator signal from another stage to generate a respective vector modulated signal, simultaneously injecting each respective vector modulated signal in each stage into its respective load circuit, converting the phase of at least one of the oscillator signals and generating a digital output substantially proportional to the input signal in accordance therewith, and wherein N is an integer greater than or equal to two.

BRIEF DESCRIPTION OF THE DRAWINGS

The invention is herein described, by way of example only, with reference to the accompanying drawings, wherein.

DETAILED DESCRIPTION OF THE INVENTION

Time mode analog to digital converters (ADCs) can be considered a special class of continuous time Sigma-Delta ($\Sigma\Delta$). ADCs that achieve first order quantization noise shaping without requiring a feedback loop. Consequently, this architecture is immune to any impairments present in the feedback loop. Such impairments may comprise non-idealities in the feedback digital to analog converter (DAC) that is normally required in a conventional RC integrator based topology.

Figure 1:
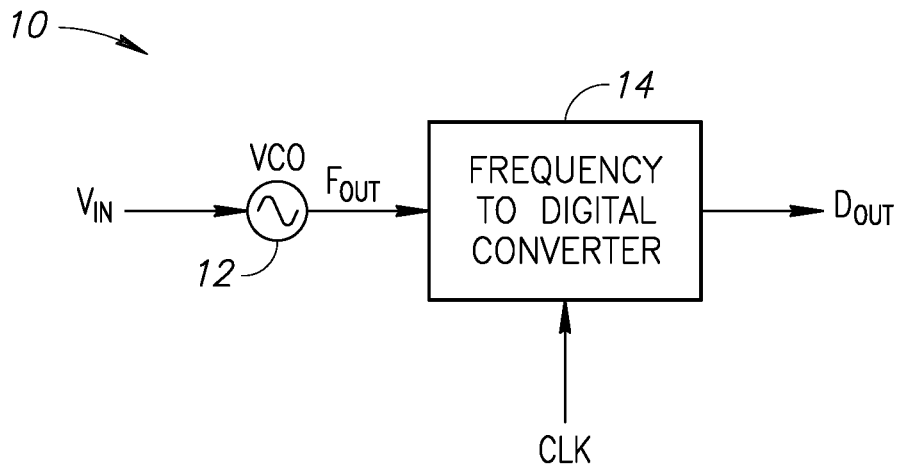
FIG. 1 is a block diagram illustrating a first example embodiment of a time mode analog to digital converter.

A block diagram illustrating a first example embodiment of a time mode analog to digital converter is shown in FIG. 1. The ADC, generally referenced 10, comprises a voltage controlled oscillator (VCO) 12 coupled to a frequency to digital converter 14.

Figure 2:
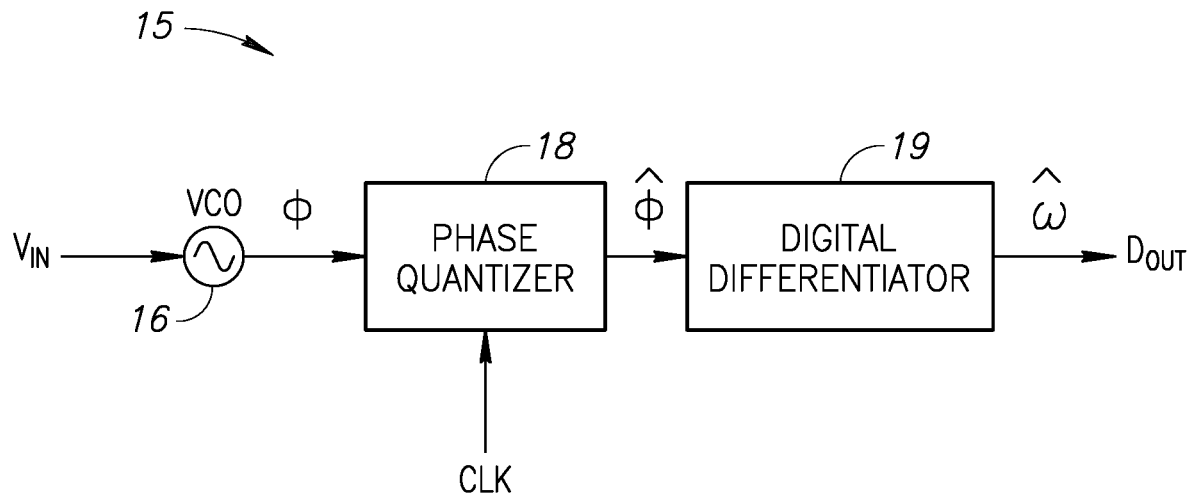
FIG. 2 is a block diagram illustrating a second example embodiment of a time mode analog to digital converter.

A block diagram illustrating a second example embodiment of a time mode analog to digital converter is shown in FIG. 2. The ADC, generally referenced 15, comprises VCO 16, phase quantizer (or phase sampler) 18 and digital differentiator 19.

With reference to FIGS. 1 and 2, in operation of the time mode ADC, the information signal $V_{IN}$ modulates the frequency of a free-running ring oscillator (RO), (i.e. VCO 12, 16). The output phase of the ring oscillator is sampled by a digital circuit (i.e. frequency to digital converter 14 or phase quantizer 18) and then differentiated over time (via digital differentiator 19) to determine the VCO frequency which is substantially proportional to the input signal.

The circuits used to implement such ADCs are typically extensively digital in nature thus enabling highly compact and scalable implementations, the power consumption and resolution of which improve with process technology.

Figure 3:
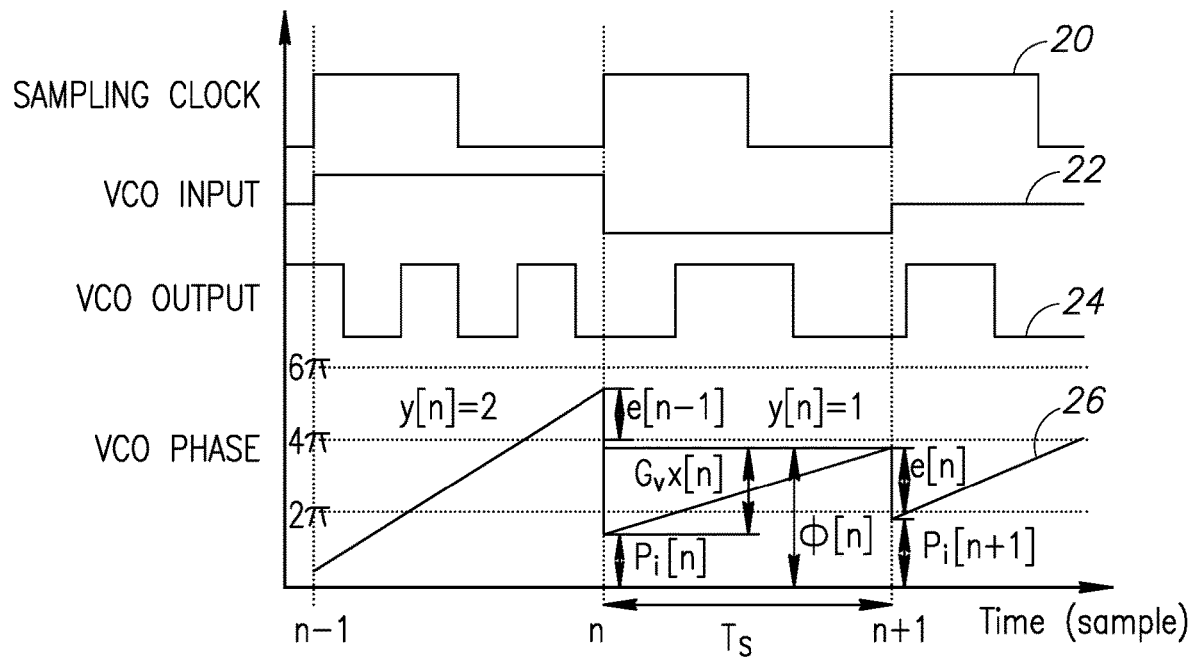
FIG. 3 is a diagram illustrating example waveforms of the first and second example embodiments of a time mode analog to digital converter.

A diagram illustrating example waveforms of the first and second example embodiments of a time mode analog to digital converter is shown in FIG. 3. This waveform plot shows several signals including a sampling clock 20, a sampled analog VCO input 22, VCO output 24 and VCO phase 26. As shown, the VCO output frequency varies in accordance with the VCO input $V_{IN}$. The phase of the VCO output is determined, the slope of which is proportional to the input voltage. A digital representation of the slope is used to determine the digitized value of $V_{IN}$. Expressions for y[n] and Y(z) are given below.

$$y[n] = \frac{1}{2\pi}(\phi[n] - e[n]) \quad (1)$$
$$= \frac{1}{2\pi}(G_v x[n] + e[n-1] - e[n])$$
$$Y(z) = \frac{1}{2\pi}(G_v X(z) + z^{-1} E(x) - E(z))$$
$$= \frac{1}{2\pi}(G_v X(z)(z^{-1} - 1)E(z))$$

wherein y[n] is unit-less sampled phase normalized to whole cycles of the VCO signal, e[n] is the quantization noise of the phase sampling process, X(z), Y(z), E(z) are z-domain transforms of x[n], y[n], e[n], respectively.

Figure 4A:
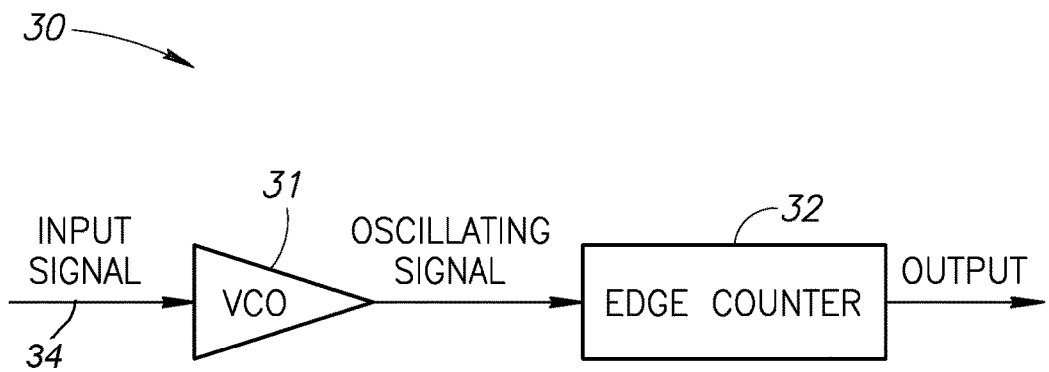
FIG. 4A is a block diagram illustrating a third example embodiment of a time mode analog to digital converter.
Figure 4B:
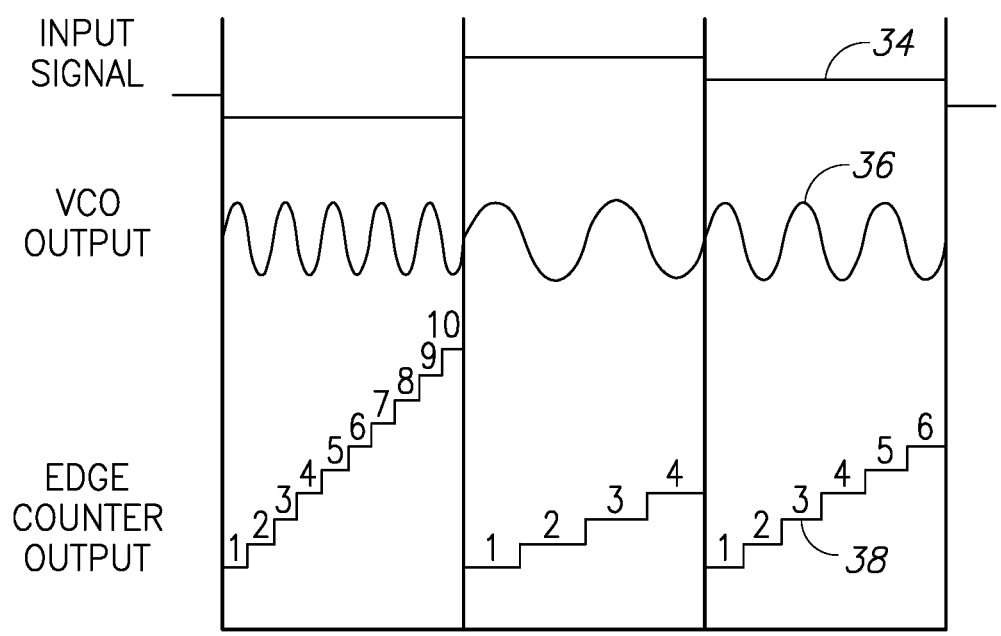
FIG. 4B is a diagram illustrating example waveforms of the third example embodiment of the time mode analog to digital converter of FIG. 4A.

A block diagram illustrating a third example embodiment of a time mode analog to digital converter is shown in FIG. 4A. A diagram illustrating example waveforms of the third example embodiment of the time mode analog to digital converter of FIG. 4A is shown in FIG. 4B. The time mode ADC circuit, generally referenced 30, comprises a VCO 31 and an edge counter 32. The waveform plot, shows several signals including the input signal 34, VCO output 36 and edge counter output 38.

In operation, the frequency of the VCO output is proportional to the value of input signal. The edge counter is operative to count the number of edges (e.g., zero crossings) of the VCO output signal. The final count at the end of each time period is used to determine the digitized value of $V_{IN}$.

Figure 5A:
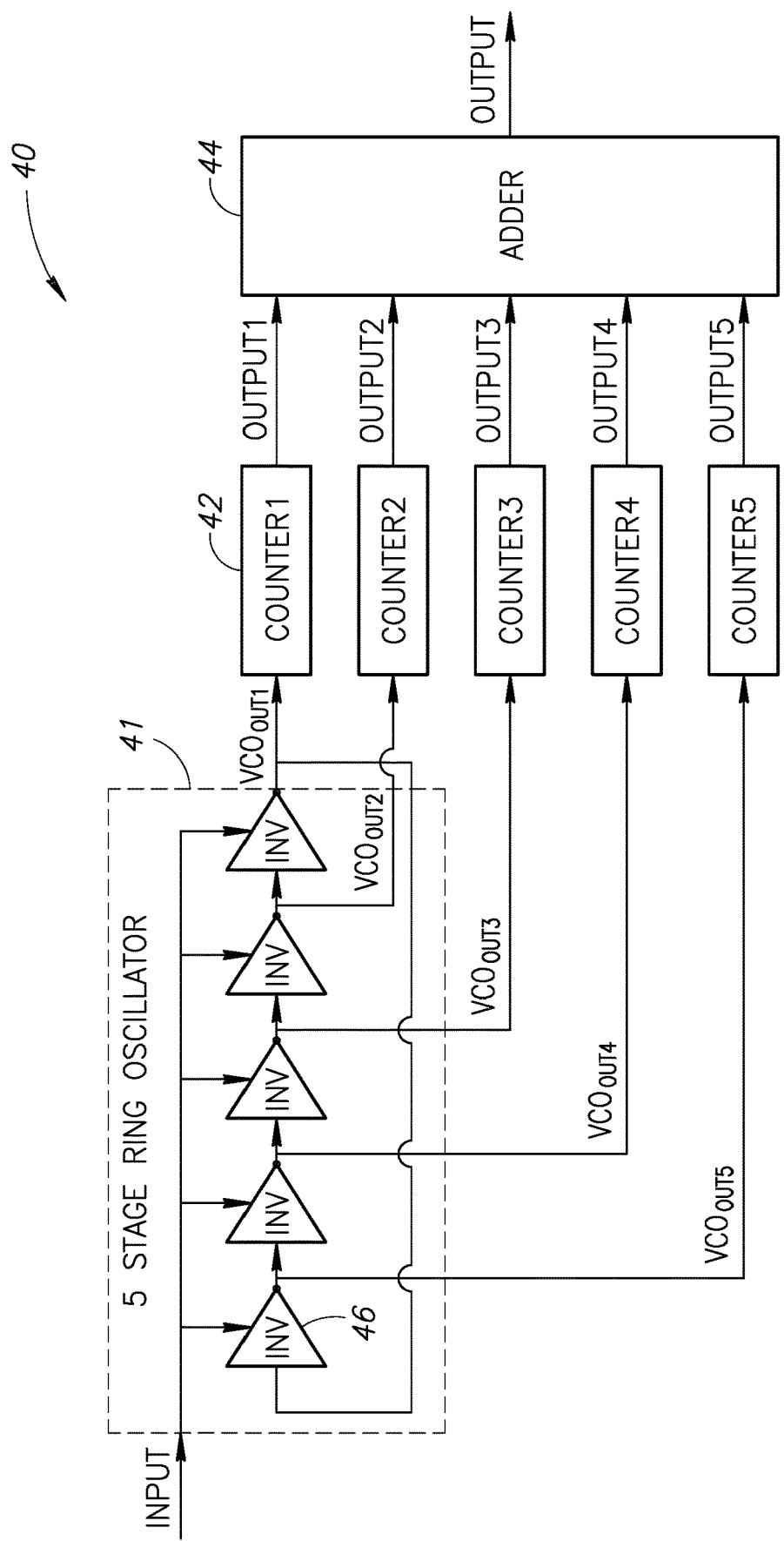
FIG. 5A is a block diagram illustrating a fourth example embodiment of a time mode analog to digital converter.
Figure 5B:
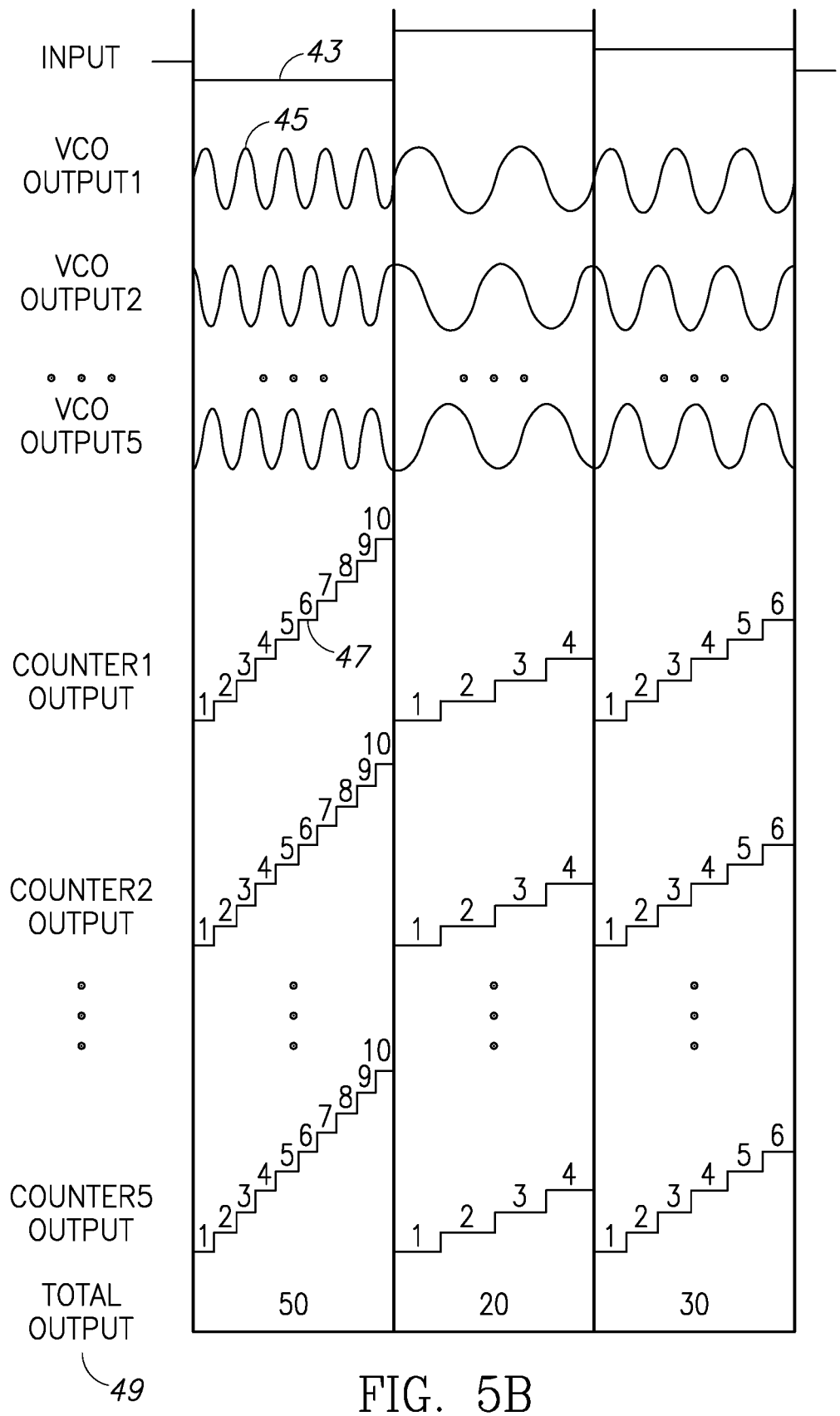
FIG. 5B is a diagram illustrating example waveforms of the first and second example embodiments of the time mode analog to digital converter of FIG. 4B.

A block diagram illustrating a fourth example embodiment of a time mode analog to digital converter is shown in FIG. 5A. A diagram illustrating example waveforms of the first and second example embodiments of the time mode analog to digital converter of FIG. 4B is shown in FIG. 5B. The time mode ADC circuit, generally referenced 40, comprises a VCO comprising an N-stage stage ring oscillator 41 (N=5 in this example embodiment) having five inverter stages 46, five edge counters 42, each coupled to one tap in the ring oscillator, and adder 44. The waveform plot, shows several signals including the input signal 43, VCO output signals $VCO_{OUT1-5}$ 45 (labeled as VCO OUTPUT1-5) for each of the five RO taps, edge counter outputs COUNTER$_{1-5}$ 47 (labeled as COUNTER1-5 OUTPUT) and a total output count 49 which is the sum of the five edge counter outputs.

In operation, the frequency of the $VCO_{OUT1-5}$ signals is proportional to the input signal. The edge counters are operative to count the number of edges (e.g., zero crossings) of each respective VCO output signal. The total of all five counter outputs at the end of each time period is used to determine the digitized value of the input. Note that the resolution of the digital output is a function of the VCO tuning range, sampling frequency as well as the number of stages on the ring oscillator.

In an ideal ADC, the digital output is a linear function of the analog input which results in high signal to noise plus distortion ratio (SNDR) and effective number of bits (ENOB). The linearity of a time mode ADC, however, is limited by the nonlinear VCO transfer function, meaning the oscillator frequency does not vary linearly over the entire range of $V_{IN}$. Consequently, the spurious free dynamic range (SFDR) and ENOB performance of the ADC degrades.

Figure 6:
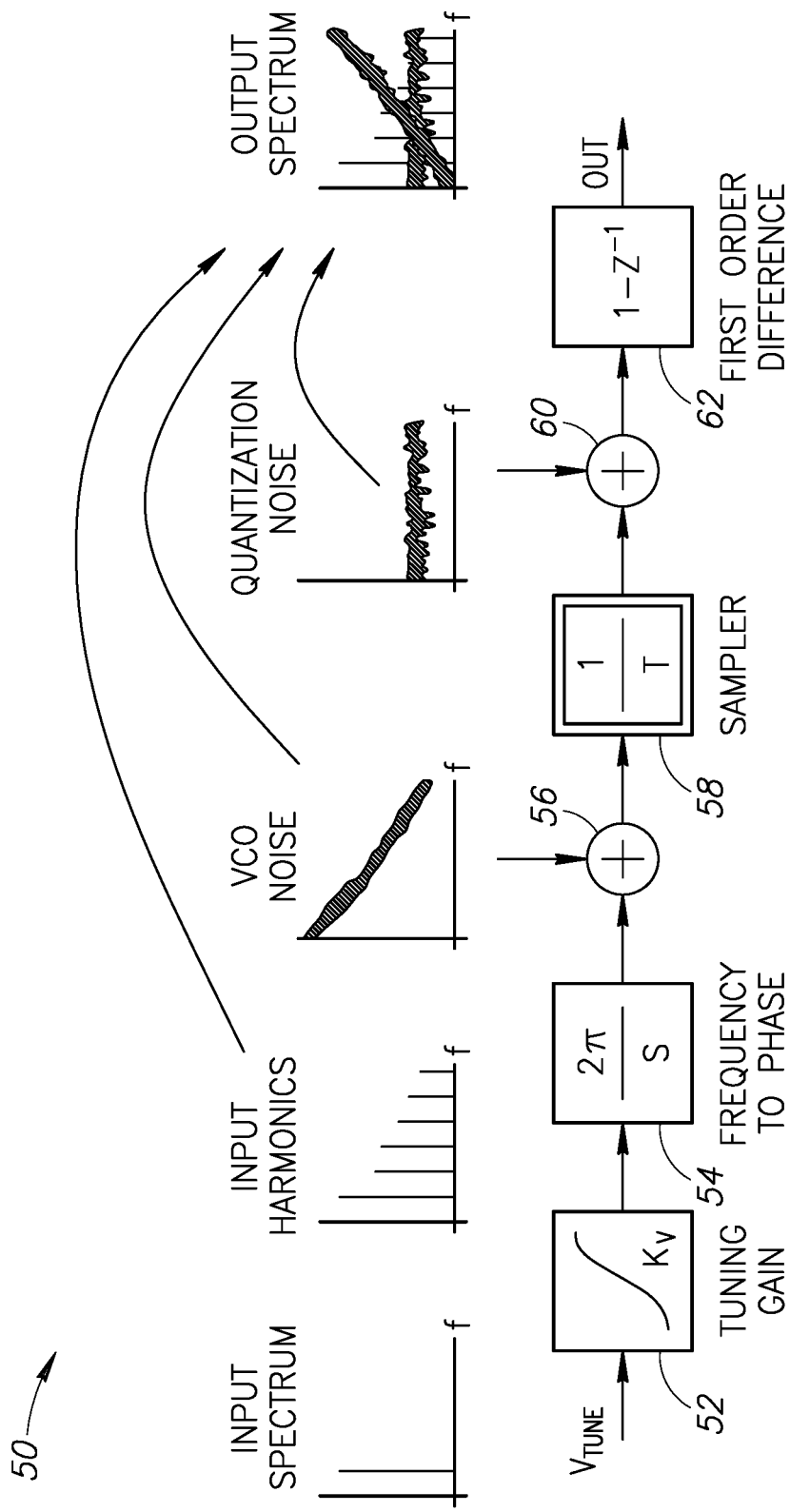
FIG. 6 is a diagram illustrating several impairments of a time mode analog to digital converter.

A diagram illustrating several impairments of a time mode analog to digital converter is shown in FIG. 6. The circuit model, generally referenced 50, comprises VCO tuning gain block 52, frequency to phase block 54, added VCO noise 56, sampler block 58, quantization noise adder 60 and first order difference block 62. This model shows that the input harmonics, VCO noise, and the quantization noise all contribute to impairments in the output spectrum.

The fundamental impairment of a time mode ADC is the nonlinear frequency tuning curve (52) which limits the linearity and dynamic range of the ADC. In one embodiment, the RO supply is varied in order to vary its oscillation frequency. Beyond a certain point, however, the voltage-to-frequency transfer function exhibits highly nonlinear behavior as well as sensitivity to process and temperature.

Thus, some of the challenges of the time mode ADCs described supra include VCO phase noise, $K_{VCO}$ nonlinearity, ring oscillator unit cell mismatch, meta-stability, and sampling clock jitter.

Figure 7:
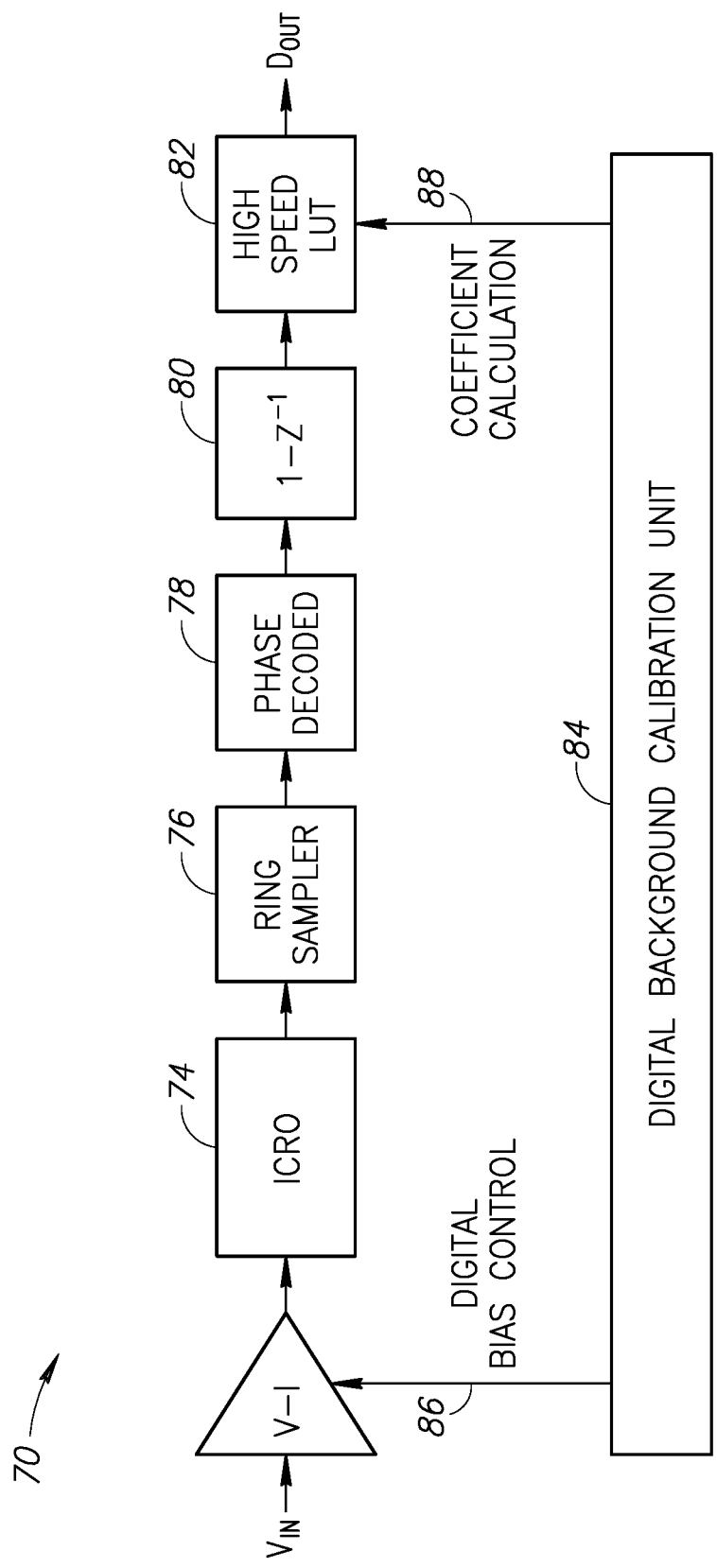
FIG. 7 is a block diagram illustrating a fifth example embodiment of a time mode analog to digital converter that utilizes calibration to improve linearity.

A block diagram illustrating a fifth example embodiment of a time mode analog to digital converter that utilizes calibration to improve linearity is shown in FIG. 7. The time mode ADC, generally referenced 70, comprises voltage to current converter 72, current controlled ring oscillator (ICRO) 74, ring sampler 76, phase decoder 78, differentiator 80, high speed look up table (LUT) 82 and digital background calibration unit 84.

Solutions to the nonlinearity problem plaguing the above described time mode ADC circuits can be categorized into either open loop or closed loop. Circuit 70 is an open loop configuration whereby the VCO is in free running mode and its transfer function is linearized through real time calibration routines applied during normal operation. The calibration unit 84 is operative to generate (1) calibration coefficients 88 which are input to the LUT for compensating the differentiated quantized phase values, and (2) a digital bias control 86 input to the converter 72. Note that open loop configurations typically exhibit better efficiency than closed loop configurations.

Note also, however, that even with real time calibration, there still remains some residual nonlinearity that cannot be compensated for which limits the noise floor of the system in addition to the VCO phase noise.

Note that either foreground or background calibration techniques may be applied to improve ADC performance as well as real time adaptive post digitization correction. This extra post processing, however, increases design complexity and current consumption. In addition, such circuits may require periodic calibration and compensation which can complicate the scheduling of events by a host controller in time intensive applications.

Figure 8:
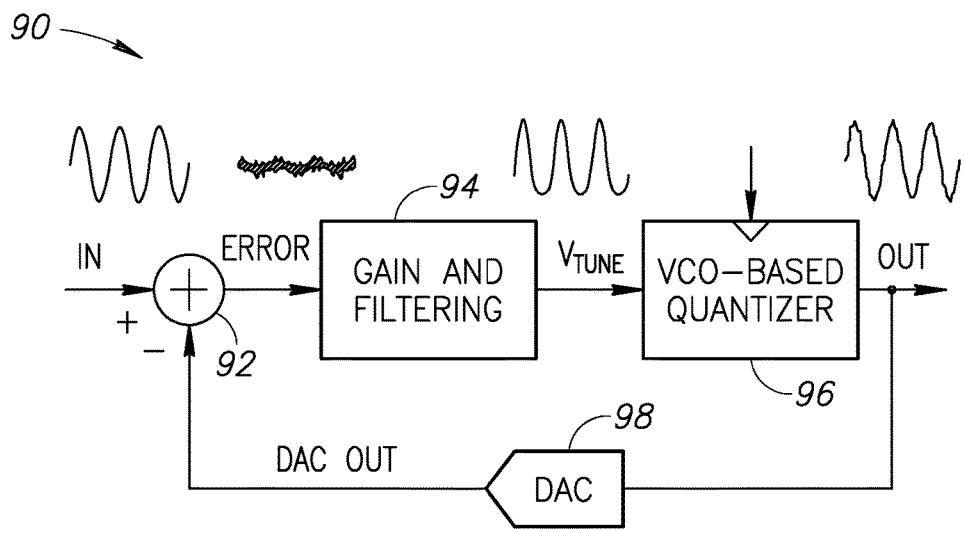
FIG. 8 is a block diagram illustrating a sixth example embodiment of a time mode analog to digital converter having a closed loop configuration to improve linearity.

A block diagram illustrating a sixth example embodiment of a time mode analog to digital converter having a closed loop configuration to improve linearity is shown in FIG. 8. The circuit, generally referenced 90, comprises summer 92, amplifier and filter 94, VCO based quantizer 96, and DAC 98.

The circuit 90 has a closed loop configuration and utilizes a feedback path to suppress the nonlinearity of the VCO. Therefore, the noise floor is dominated by the VCO phase noise which is the best possible performance for this ADC. The disadvantage of using a closed loop approach is reduced efficiency and higher design complexity. An advantage, however, is that closed loop configurations typically exhibit better SNDR than open loop configurations.

Figure 9:
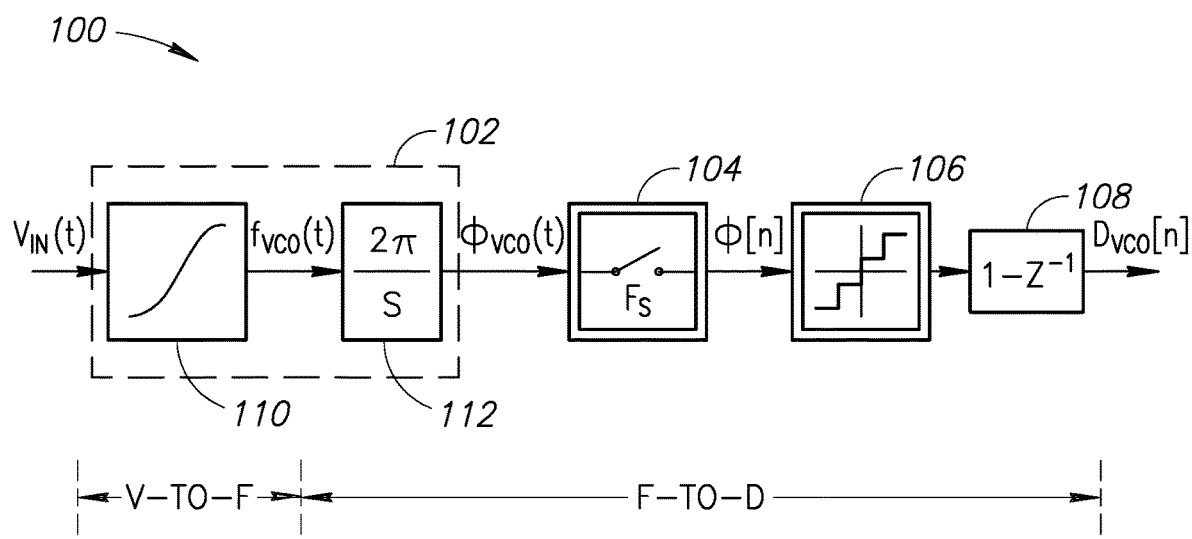
FIG. 9 is a block diagram illustrating a seventh example embodiment of a time mode analog to digital converter.

A block diagram illustrating a seventh example embodiment of a time mode analog to digital converter is shown in FIG. 9. The circuit, generally referenced 100, comprises a ring oscillator 102, sampler 104, phase quantizer 106 and differentiator 108.

Figure 16:
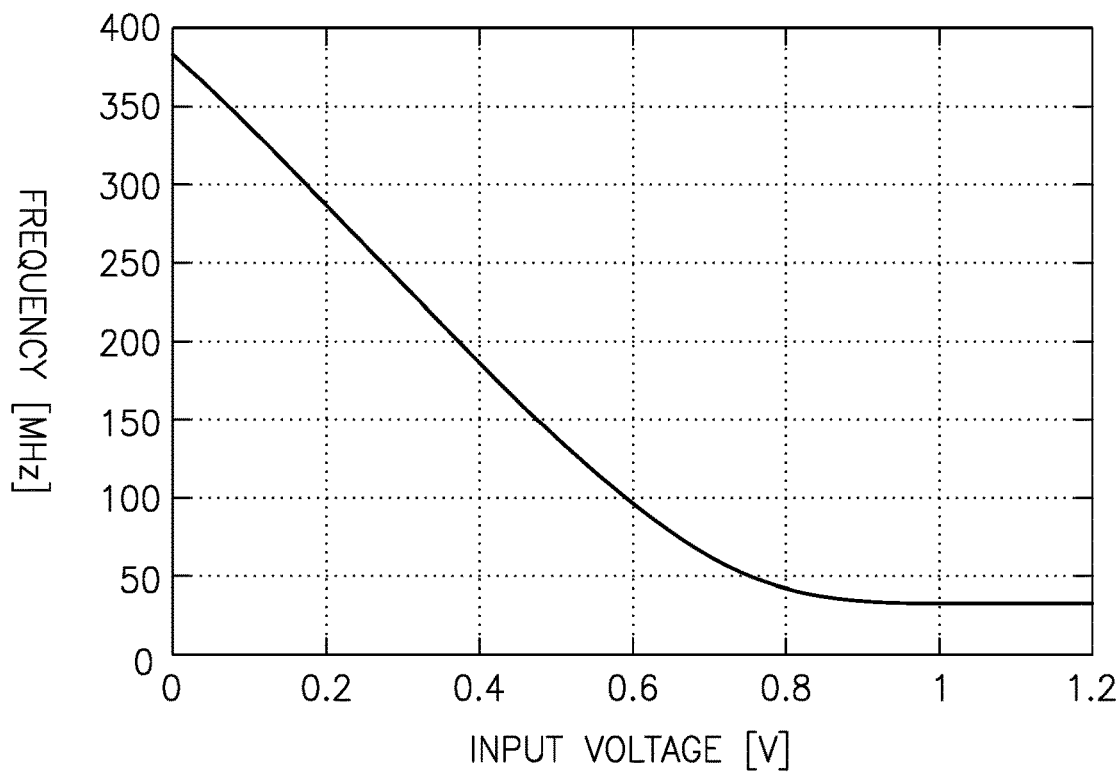
FIG. 16 is a graph illustrating the performance of a time mode analog to digital converter that does not employ injection locking.

As stated supra, the fundamental issue limiting the performance of a time mode ADC is the nonlinearity of the VCO gain $K_{VCO}$. The ADC circuits described supra are configured to compensate for this nonlinearity.

$$\phi[n] = \int_{(n-1)T}^{nT} 2\pi[K_{VCO}V_{in}(nT) + f_o]dt \quad (2)$$

$$D_{VCO}[n] = \frac{N}{\pi}[2\pi K_{VCO}V_{in}(nT)] + \varphi_{eq}[n-1] - \varphi_{eq}[n]$$

where $\phi[n]$ is the VCO phase sample at a discrete-time index n, $V_{in}(nT)$ is the ADC input sample, $f_o$ is the free running VCO frequency, N is the number of stages in the ring oscillator, $\varphi[n]$ and $\varphi[n-1]$ are two consecutive phase quantization error samples, $D_{VCO}[n]$ is the digitized frequency of the VCO. The frequency as a function of $V_{in}$ for a typical ring oscillator is shown in FIG. 16.

Figures 10A, 10B:
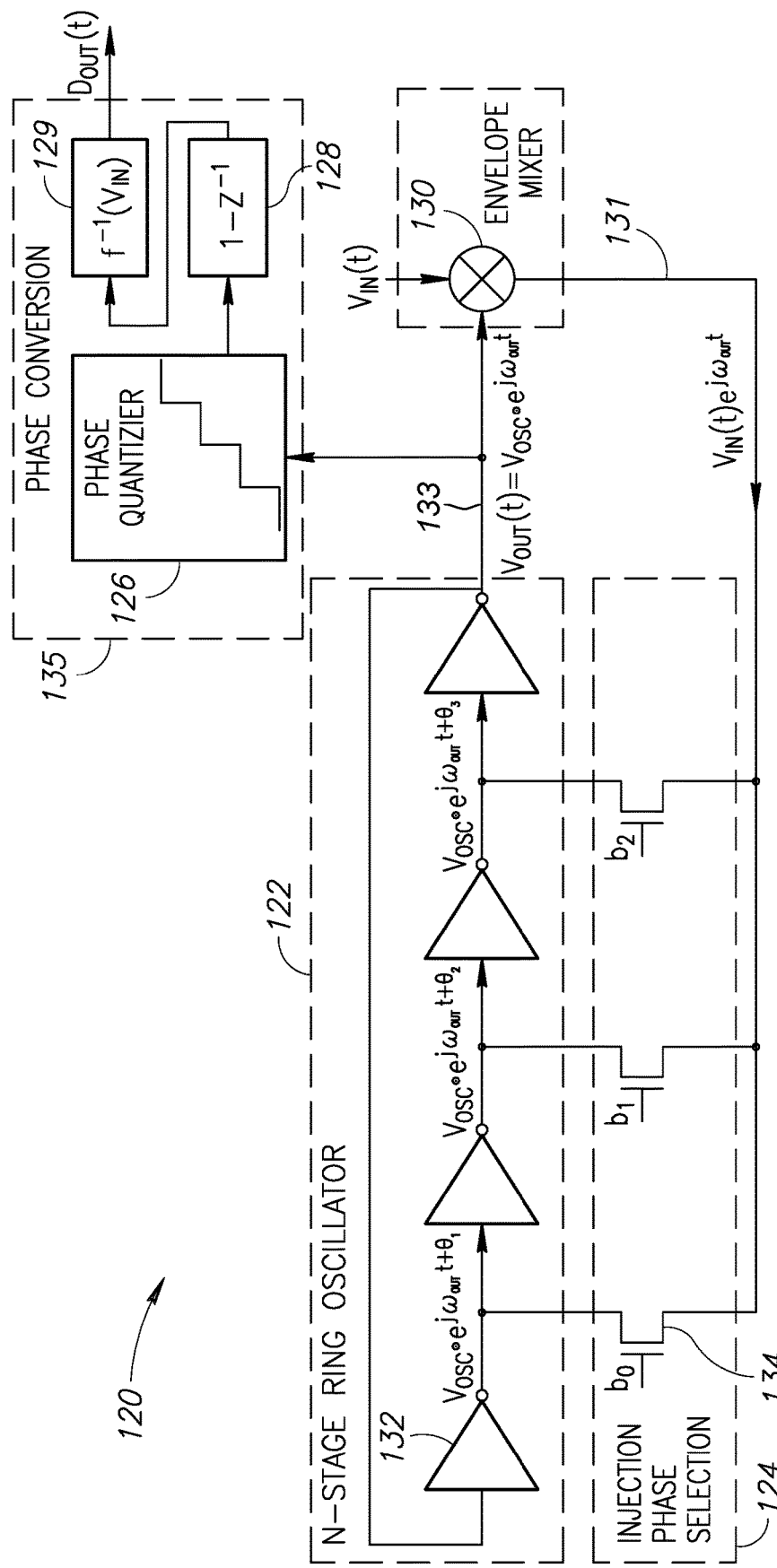
FIG. 10A is a block diagram illustrating an eighth example embodiment of a time mode analog to digital converter utilizing injection locking to improve linearity.
FIG. 10B is a diagram illustrating the composite vector injected into the RO.

A block diagram illustrating an eighth example embodiment of a time mode analog to digital converter utilizing injection locking to improve linearity is shown in FIG. 10A. A diagram illustrating the composite vector injected into the RO is shown in FIG. 10B. The circuit, generally referenced 120, comprises an N-stage ring oscillator 122, envelope mixer 130 (also referred to as a modulator), injection phase selector 124, and phase converter 135. In one embodiment, the phase converter 135 comprises phase quantizer (or sampler) 126, differentiator 128, and (optional) look up table (LUT) 129 which implements $f^{-1}(V_{IN})$. The LUT functions to generate the digital output in accordance with the frequency output from the differentiator. The LUT represents a mathematical relationship between the oscillator frequency and the input signal. It also essentially performs a mapping from the oscillator frequency to the digital output signal.

The ADC circuit 120 is configured to overcome the VCO nonlinearity problem described supra. In this circuit, the VCO frequency is modulated using injection locking rather than varying its supply voltage. In accordance with the invention, the ring oscillator 122 is injection locked with an envelope modulated signal 131, the frequency of which is derived from the RO itself. The operation is performed by tapping the output 133 of the N-stage RO and mixing it with input voltage $V_{in}(t)$ via mixer 130. The output 131 of the mixer 130 is at the same frequency as the RO with an envelope determined by $V_{in}(t)$. This signal is injected back into the RO at one or more points controlled by switches 134 via $b_{0-2}$. Note that any number of stages N≥2 may be used to construct the RO. Note that throughout this document the envelope modulated signal can generally be referred to as a vector modulated signal as the mixer (i.e. modulator) can perform amplitude modulation, or phase modulation (by controlling an extra delay) and can comprise a current or voltage signal.

The phase selection control ($b_{0-2}$ in this example embodiment) determines which stage of the RO the signal 131 is injected into. In one embodiment, only one of the stages (i.e. phases) is selected at one time. The choice of RO phase or stage determines how much the injection locking range (or FM range) is scaled. Thus, the tuning range of the RO is enhanced. Note that the FM is performed by the time varying envelope of $V_{in}(t)$. The FM signal $V_{out}(t)$ 133 is input to the phase quantizer and digital backend for further processing and generation of the digital output $D_{out}(t)$.

The phasor representation of the signals in the voltage domain at the node where the injected signal is induced is shown in FIG. 10B. In this figure, $V_{osc}$ is the RO signal and $V_{in}(t)$ is the injected signal at an angular displacement $\theta_n$ (i.e. $\theta_{0-2}$) with respect to $V_{osc}$ determined by the switch control b. (i.e. $b_{0-2}$). The magnitude of the composite vector is determined by $V_{in}(t)$ which in turn modulates the phase shift introduced in the load. As a result, the frequency of the RO $\omega_{out}(t)$ changes in order to satisfy the Barkhausen criteria for oscillation. The relationship between $V_{in}(t)$ and $\omega_{out}(t)$ is derived based on Adler's equation for an injection locked oscillator which shows that $\omega_{out}(t)$ is linearly proportional to $V_{in}(t)$. Note that the injection point into the ring oscillator is digitally controlled and thus scales the injection locking range (or frequency modulation (FM) range).

Expressions for the RO stage frequency, phase, and oscillator output frequency of the circuit 120 are given below. The injection locking can be used to control the resonating frequency of an LC tank oscillator as described in detail in U.S. Publication No. 2016/0099720, entitled "Wideband Digitally Controlled Injection-Locked Oscillator", incorporated herein reference in its entirety.

$$f_m(t) = f_o \frac{V_{in}(t)}{V_{osc}} \cdot \frac{4}{N \cdot \sin\frac{2\pi}{N}} \quad (3)$$

$$\theta = \sin^{-1}\left(\frac{f_o - f_{inj}}{f_o} \cdot \frac{N}{2} \cdot \sin\frac{2\pi}{N} \cdot \alpha\right)$$

$$\omega_{out} = 2\pi(f_o + f_m(t))$$

where $f_m(t)$ is the RO stage output frequency as a function of time, $f_o$ is the free running RO frequency, $f_{inj}$ is the injected signal frequency, N is the number of RO stages, $V_{in}(t)$ is the input signal, $\theta$ is the RO stage delay, and $V_{osc}$ is the RO stage input signal. Note that the second factor in the equation for $f_m(t)$ is a scaling factor that is controlled by $\theta$. Scaling of the injection locking range (frequency modulation range) is determined by the stage of the oscillator selected for injection of the envelope modulated signal.

Figure 11A:
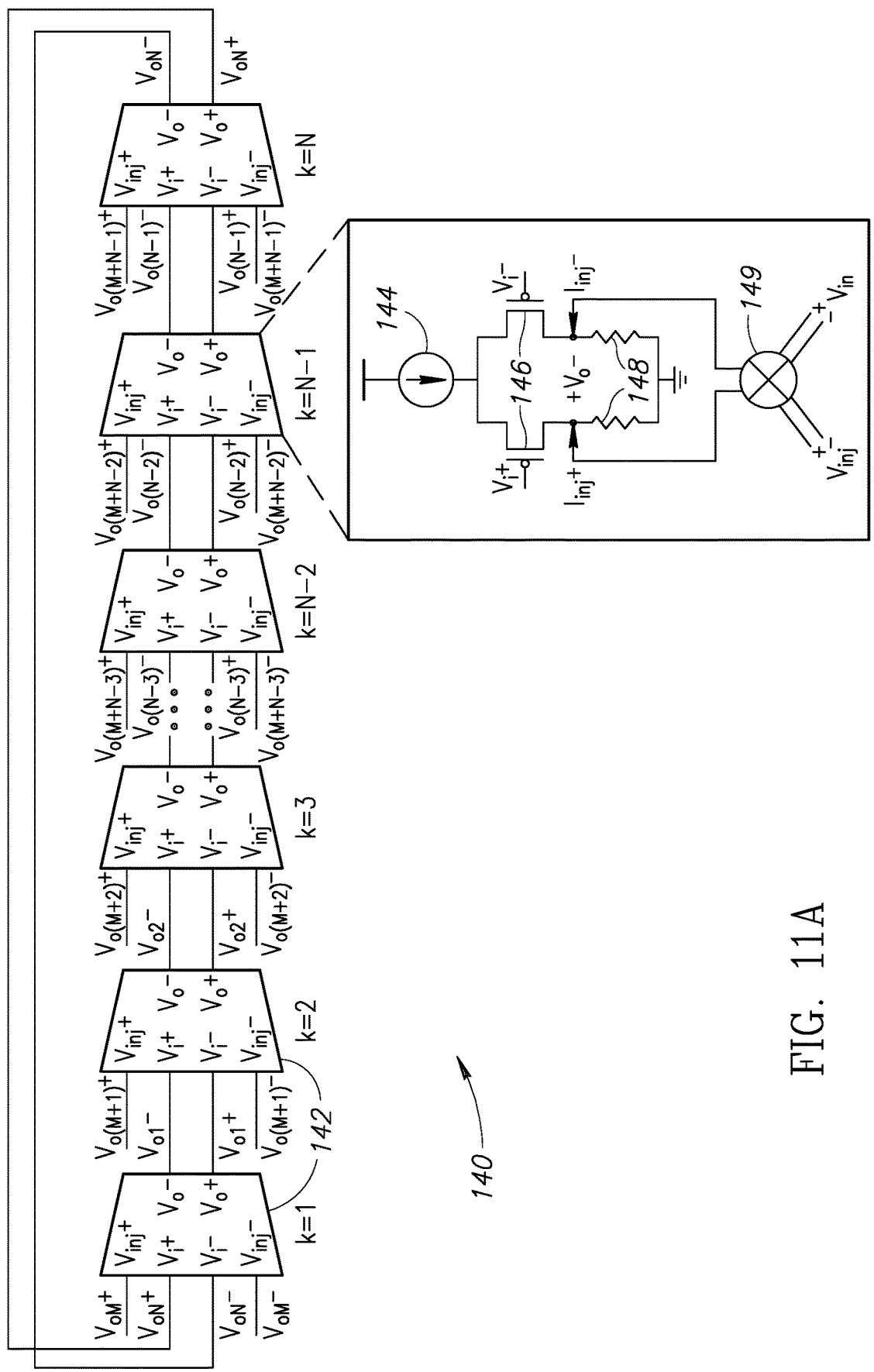
FIG. 11A is a block diagram illustrating a ninth example embodiment of a time mode analog to digital converter utilizing injection locking to improve linearity.

A block diagram illustrating a ninth example embodiment of a time mode analog to digital converter utilizing injection locking to improve linearity is shown in FIG. 11A. One disadvantage of the ADC circuit 120 shown in FIG. 10A is that is suffers from non-uniform phase displacement across the N stages of the RO which potentially impacts the linearity of the ADC. This issue is addressed in the circuit 140 shown in FIG. 11A.

The circuit, generally referenced 140, comprises a plurality of N stages (or cells) 142, wherein each stage (differential in this example) comprises a mixer 149 that receives as input both the input signal and an injection signal. The mixer output is injected into a load circuit in each stage (or tap) of the RO simultaneously. The angular displacement of the injected signal $\theta$ is fixed in this embodiment by tapping the injected signal output at M stages either preceding or following the point of injection, where M is an integer, e.g., −2, 1, 3, etc. The value of M is selected based on the desired voltage-to-frequency gain and tuning range and linearity.

Each stage (or cell) of the RO incorporates a differential delay circuit (i.e. current source 144, transistor pair 146 and resistor 148) and a mixer 149 that induces injection current $I_{inj}$ into the RO load. The phenomenon governing the relationship between $\omega_{out}(t)$ and $V_{in}(t)$ is similar to circuit 120 (FIG. 10A) described in detail supra. The topology of circuit 140 thus results in uniform phase resolution across the RO, enhancement of the VCO gain $K_{VCO}$, and exhibits improved figure of merit (FoM) compared to circuit 120 (FIG. 10A). Note that any number of stages N≥2 may be used to construct the RO. Note also that the circuit 140 comprises a phase converter such as phase converter circuits 135 (FIG. 10A) and 234 (FIG. 14A) which is not shown in FIG. 11A for clarity sake. One of the oscillator stage output signals VoN+ and VoN− is tapped and input to the phase converter circuit to generate the ADC digital output.

Figure 11B:
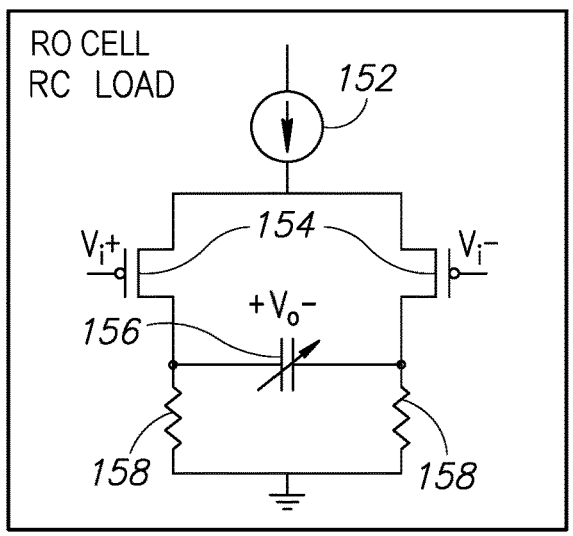
FIG. 11B is a schematic diagram illustrating a first example ring oscillator cell in more detail.
Figure 11C:
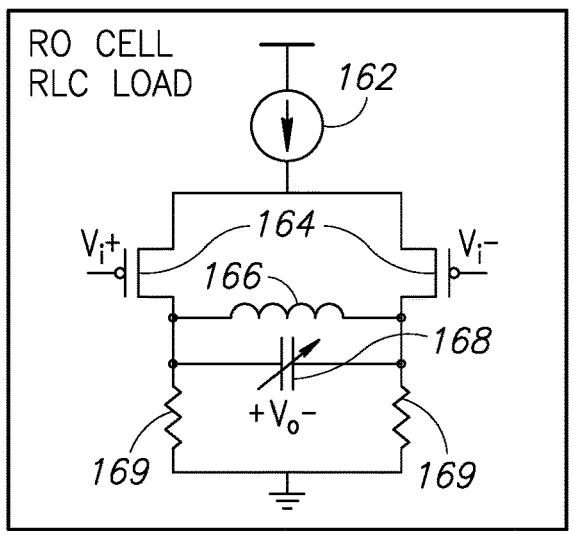
FIG. 11C is a schematic diagram illustrating a second example ring oscillator cell in more detail.
Figure 11D:
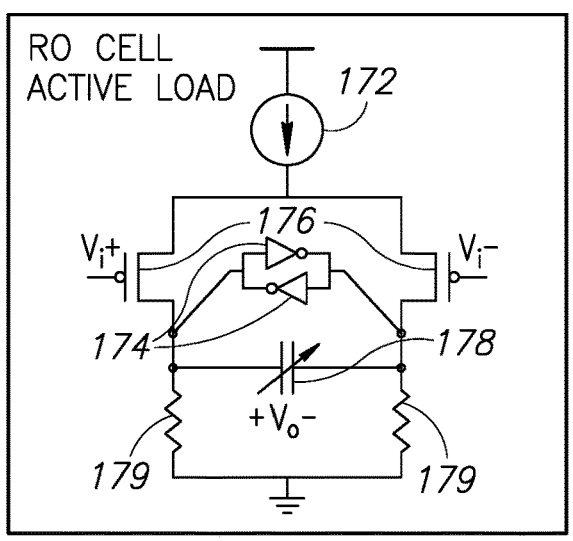
FIG. 11D is a schematic diagram illustrating a third example ring oscillator cell in more detail.
Figure 17A:
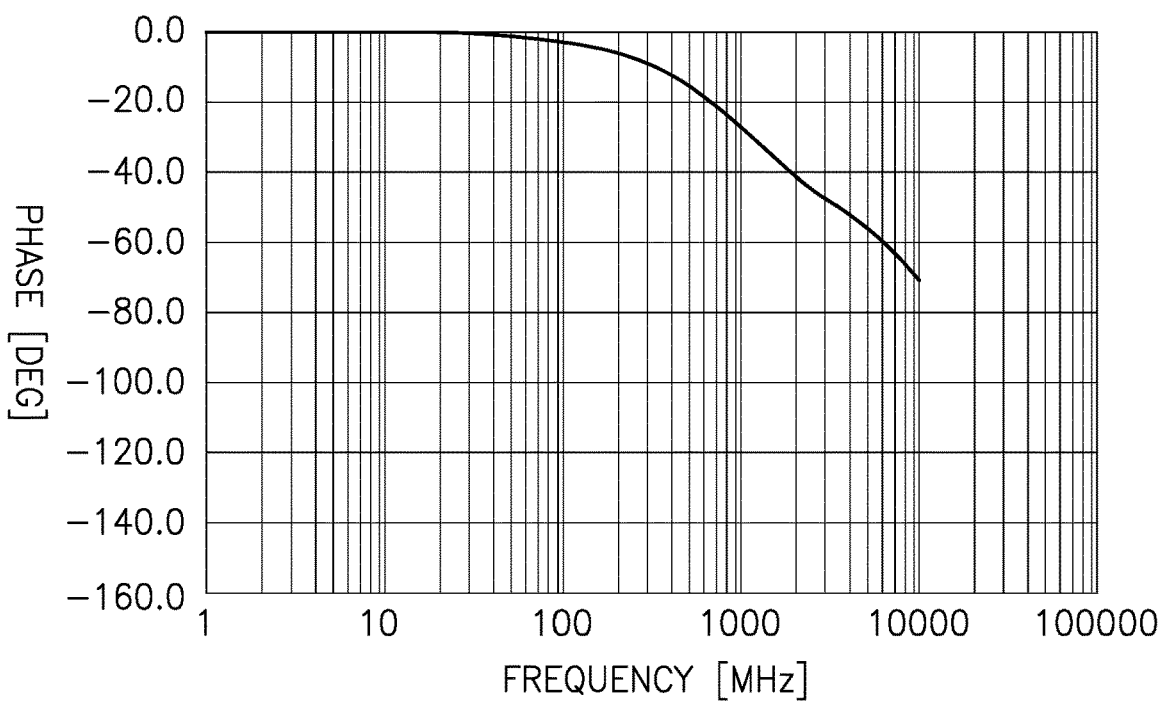
FIGS. 17A and 17B are graphs illustrating the performance of the injection locked ADC circuit of FIG. 11A incorporating RC load based stages.
Figure 17B:
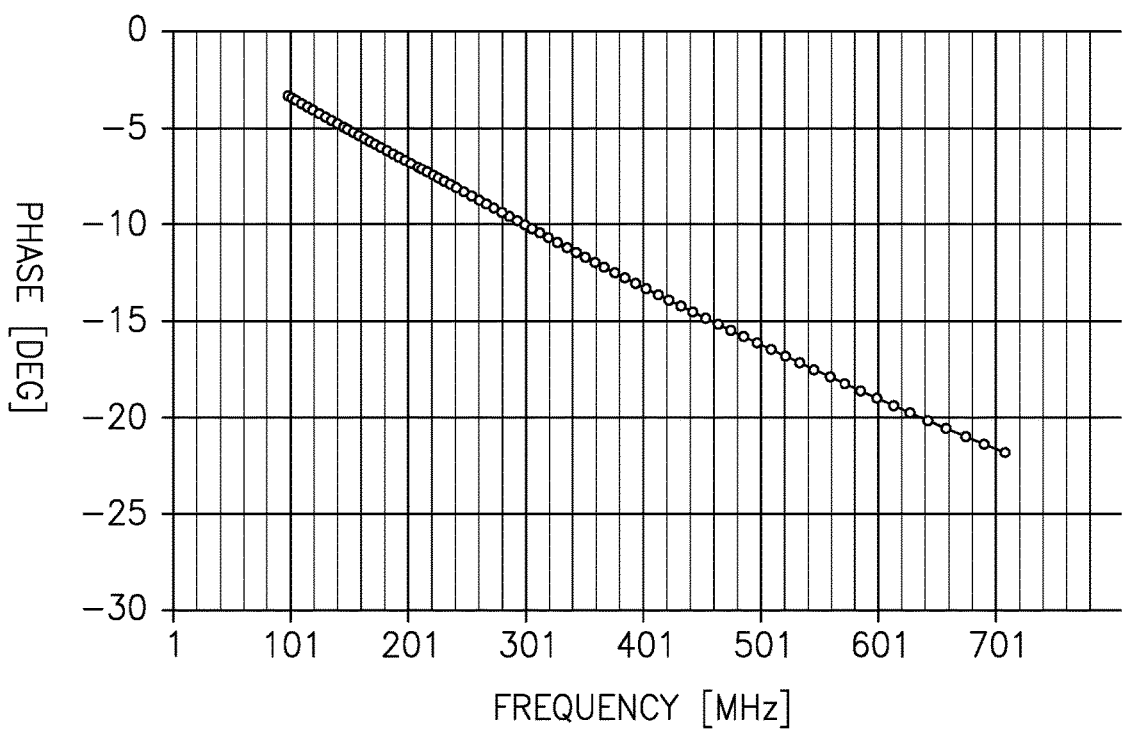
Figure 18:
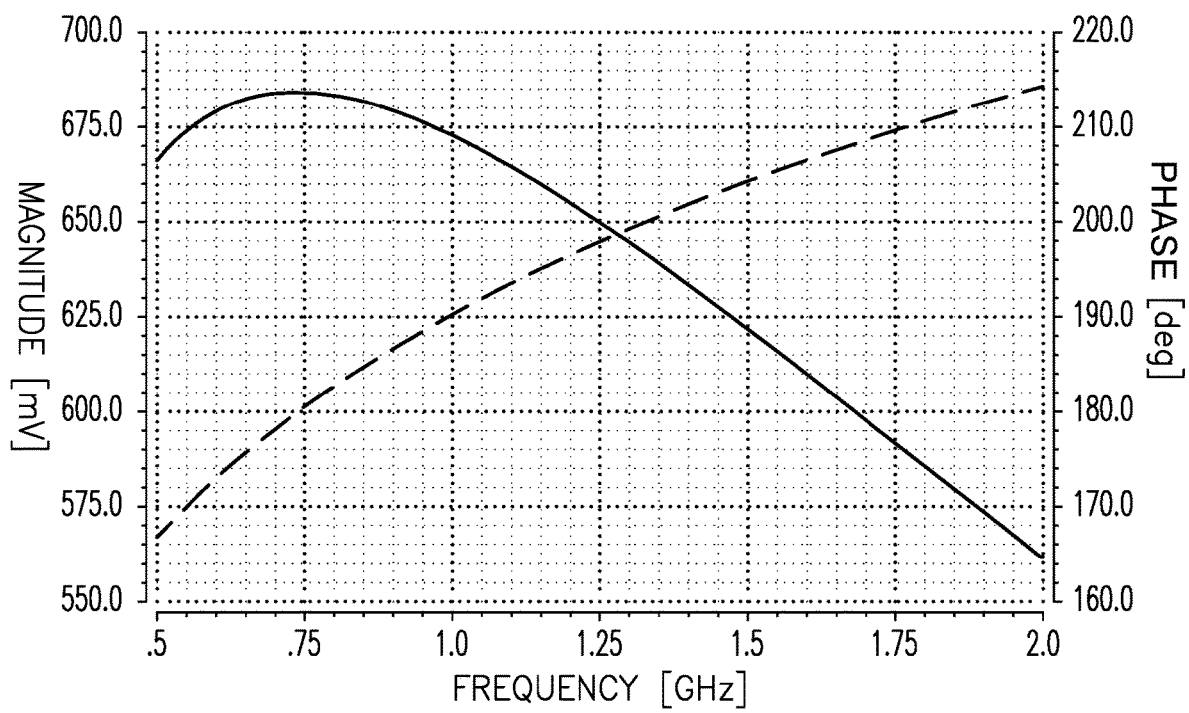
FIG. 18 is a graph illustrating the magnitude and phase response of the injection locked ADC circuit of FIG. 11A incorporating RLC based stages.

FIGS. 11B, 11C, and 11D illustrate various embodiments for the RO cell. Each embodiment exhibits a unique phase-frequency relationship of the RO load that affects the $\omega_{out}(t)$ and $V_{in}(t)$ relationship over a wide frequency range. In particular, RO cell 150 comprises current source 152, transistor pair 154, resistor pair 158, and variable capacitor 156. This simplistic RO cell has a limited frequency tuning range that is dictated by the load resistance and variable capacitor. A typical frequency tuning curve is shown in FIGS. 17A and 17B. RO cell 160 comprises current source 162, transistor pair 164, resistor pair 169, variable capacitor 168, and inductor 166. This structure can achieve wider tuning range, especially if the inductor quality factor Q is low, as shown in FIG. 18. RO cell 170 comprises current source 172, transistor pair 176, resistor pair 179, variable capacitor 178, and back to back inverters 174. This configuration has a feed-forward path that introduces a transfer function zero into the system creating desirable frequency tuning characteristics.

Figure 12:
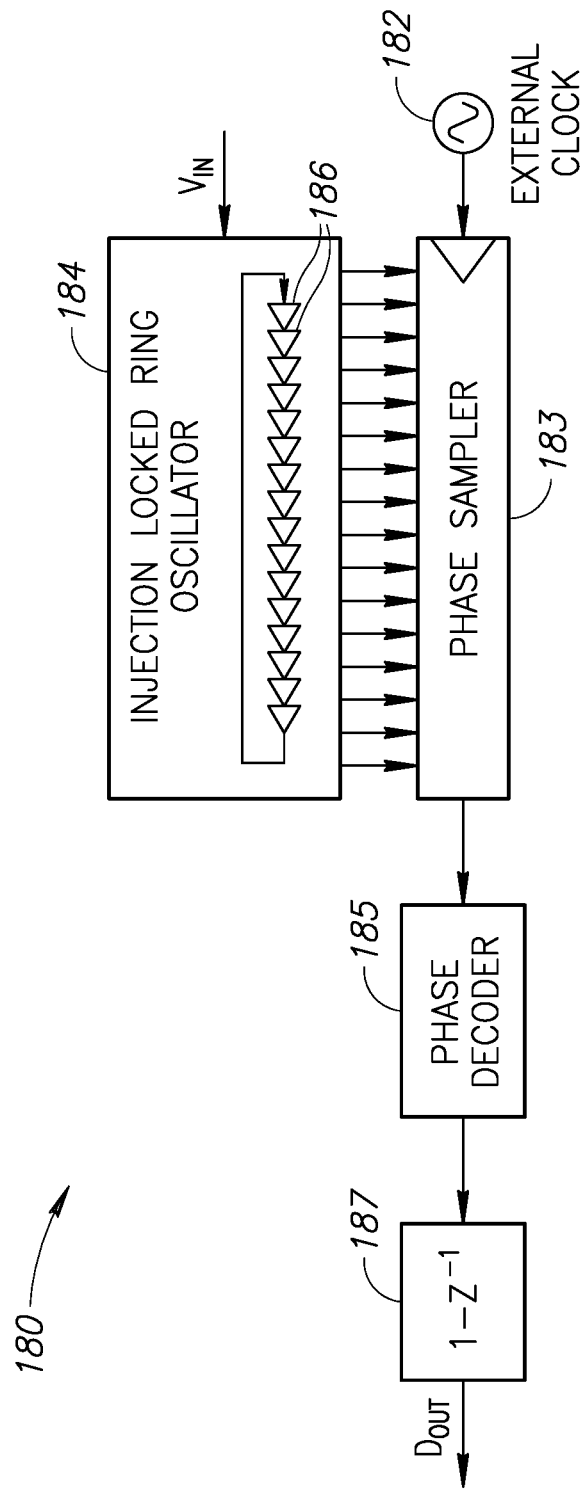
FIG. 12 is a block diagram illustrating a tenth example embodiment of a time mode analog to digital converter utilizing injection locking to improve linearity.

A block diagram illustrating a tenth example embodiment of a time mode analog to digital converter utilizing injection locking to improve linearity is shown in FIG. 12. The ADC circuit, generally referenced 180, comprises external clock source 182, injection locked RO 184 with N-stages 186, phase sampler 183, phase decoder 185, and differentiator 187. The injection locked RO may include the circuits 120, 140 of FIGS. 10A, 11A described in detail supra.

Note that in this embodiment, a relatively large number of stages in the RO are typically required to sufficiently reduce phase noise quantization. The RO, however, is the most current consuming block in the VCO based ADC. The number of stages in the RO is reduced in an eleventh ADC embodiment described below.

Figure 13:
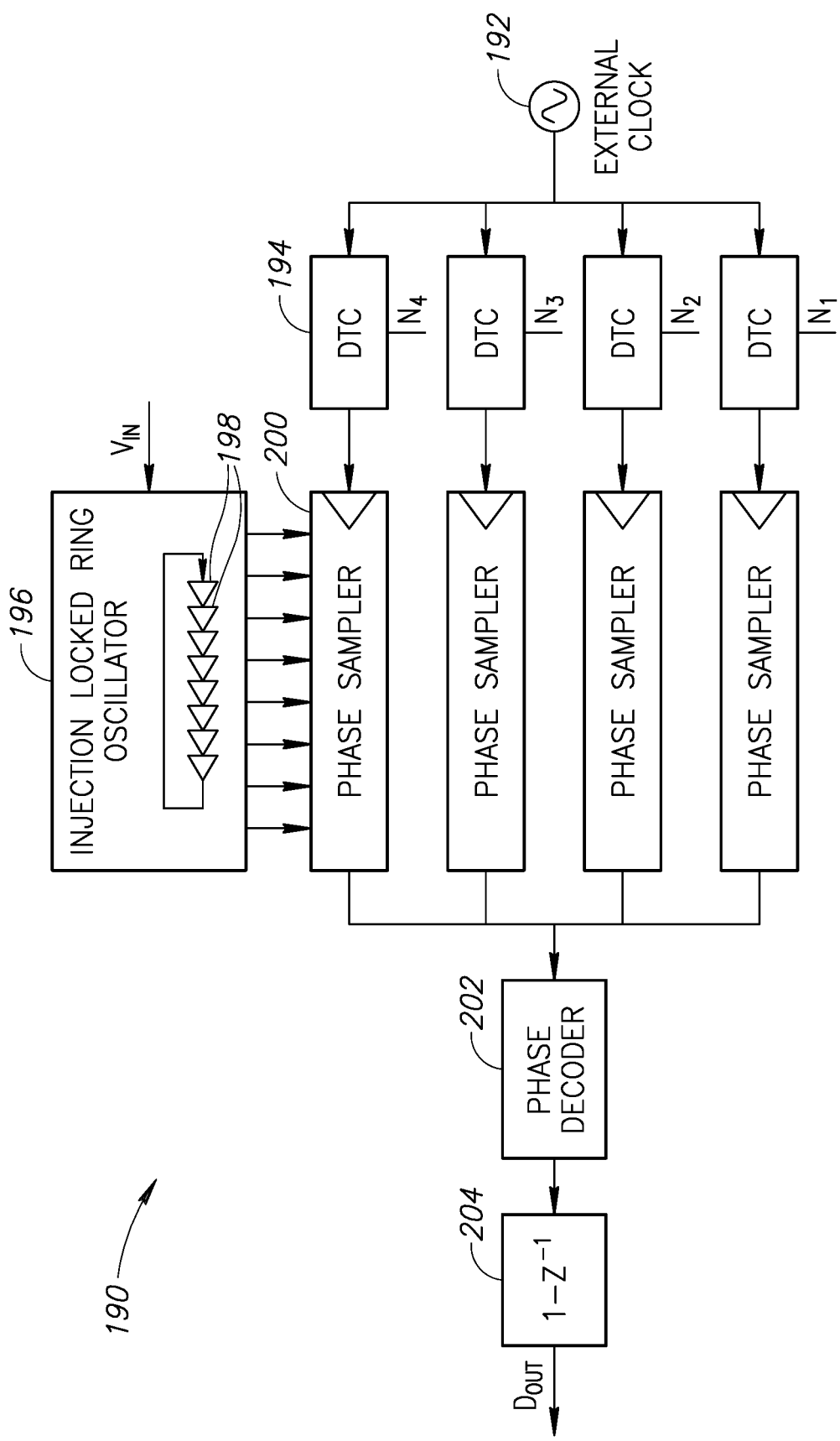
FIG. 13 is a block diagram illustrating a eleventh example embodiment of a time mode analog to digital converter utilizing injection locking to improve linearity.

A block diagram illustrating an eleventh example embodiment of a time mode analog to digital converter utilizing injection locking to improve linearity is shown in FIG. 13. The ADC circuit, generally referenced 190, comprises an external clock source 192 coupled to a plurality of digital to time converter (DTCs) 194 (e.g., four in this example embodiment), a plurality of phase samplers 200 (e.g., four in this example embodiment) each clocked by the output of a respective DTC, phase decoder 202, and differentiator 204.

ADC circuit 190 is an improved architecture over circuit 180 (FIG. 12) that reduces the number of delay stages in the RO by time interleaving the phase sampling operation. In particular, the number of stages of the RO is reduced by manipulating parallel phase samplers with staggered sampling clocks with finite delay between them. It is noted that the power consumption increase caused by the additional phase samplers is offset by the reduction in the RO power.

This embodiment comprises a plurality of multiple phase samplers 200 gated by a uniquely delayed version of the external clock 192. The delay between the clocks of the phase samplers is determined by the digital code $N_n$ input to a digital-to-time converter (DTC) 194. The outputs of the phase samplers are combined and decoded (via phase decoder 202) before differentiating over time (via differentiator 204) to determine the RO frequency.

Figure 14A:
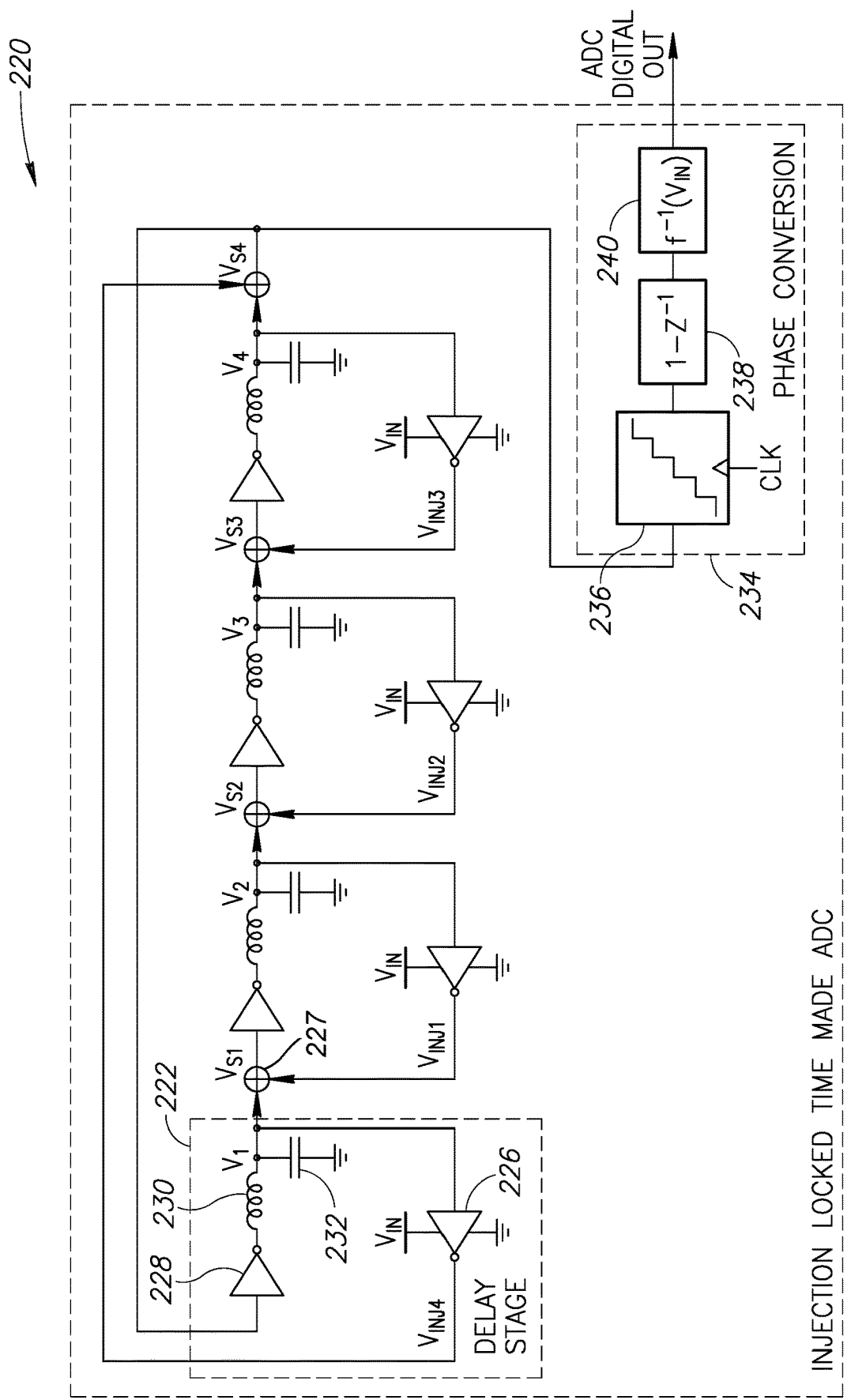
FIG. 14A is a block diagram illustrating a twelfth example embodiment of a time mode analog to digital converter utilizing injection locking to improve linearity.
Figure 14B:
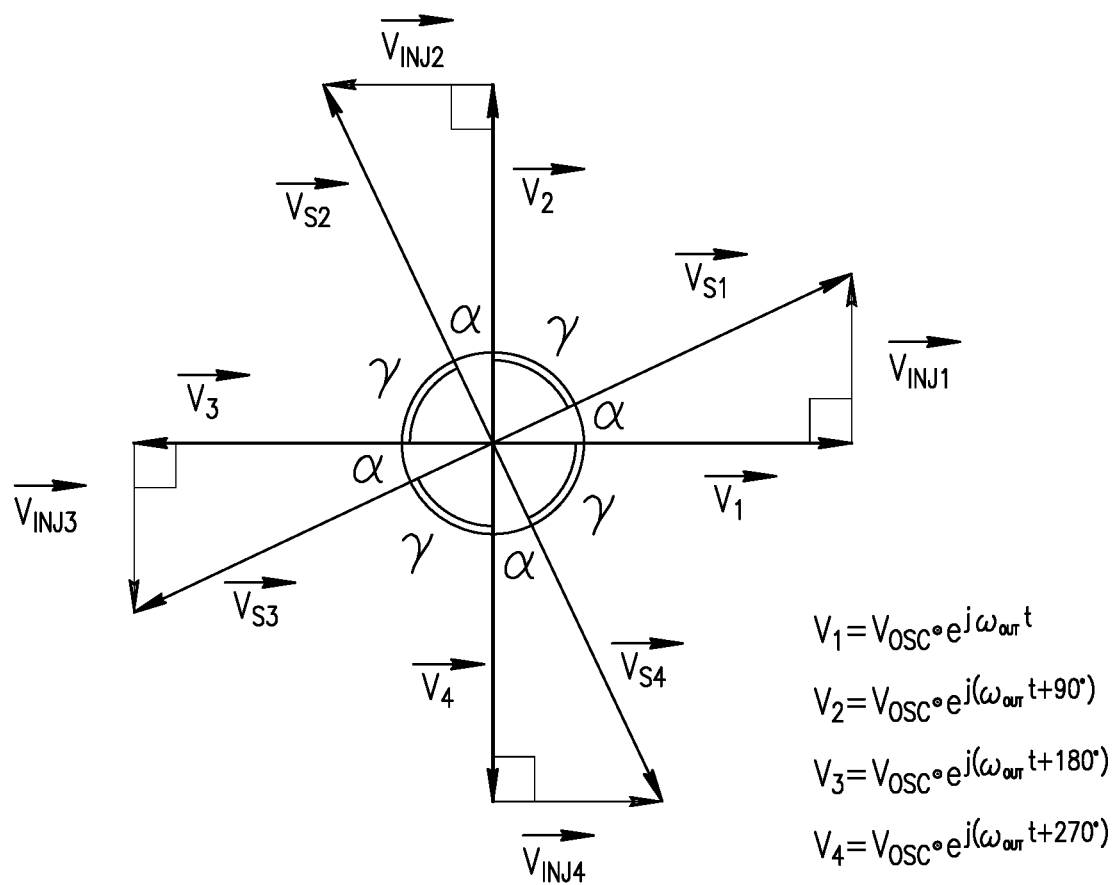
FIG. 14B is a diagram illustrating the phasor representation of the voltage signals in the circuit of FIG. 14A.

A block diagram illustrating a twelfth example embodiment of a time mode analog to digital converter utilizing injection locking to improve linearity is shown in FIG. 14A. A diagram illustrating the phasor representation of the voltage signals in the circuit of FIG. 14A is shown in FIG. 14B. The injection locked time mode ADC circuit, generally referenced 220, comprises an N-stage ring oscillator (four stage RO shown for example purposes only) where each delay stage 222 comprises a summer (or summing node) 227, and an inverter circuit 228 whose output is coupled to an LC including inductor 230 and capacitor 232 connected in series.

Similar to the ADC circuit 140 (FIG. 11A), circuit 220 also employs individual mixers (i.e. modulators) in each oscillator stage. The mixer in each stage comprises a power efficient inverter 226 whose supply voltage is coupled to the input signal $V_{IN}$. Alternatively, the signal $V_{IN}$ can control a current starved bias. The input to the inverter, like circuit 140 (FIG. 11A), may comprise any of the oscillator signals from other stages. For example, the input to the inverter in the first delay stage of the ring oscillator may comprise signals $V_2$, $V_3$ or $V_4$. The input to the inverter in the second delay stage of the ring oscillator may comprise signals $V_1$, $V_3$ or $V_4$. Expressions for the four signals $V_{1-4}$ are given below.

$$V_1 = V_{osc} \cdot e^{j\omega_{out}t}$$

$$V_2 = V_{osc} \cdot e^{j(\omega_{out}t + 90°)}$$

$$V_3 = V_{osc} \cdot e^{j(\omega_{out}t + 180°)}$$

$$V_4 = V_{osc} \cdot e^{j*\omega_{out}t + 270°} \quad (4)$$

where $V_{OSC}$ is the peak oscillator voltage considering the amplitude of vectors $V_{1-4}$ and is determined by the properties of the inverter and the load at its output.

The circuit 220 also comprises a phase converter 234 that includes a clocked phase quantizer (or sampler) 236, phase differentiator 238, and look up table (LUT) 240. The LUT functions to generate the digital output in accordance with the frequency output from the differentiator. The LUT represents a mathematical relationship between the oscillator frequency and the input signal. It also essentially performs a mapping from the oscillator frequency to the digital output signal.

An advantage of the circuit 220 is that it improves the overall power efficiency of the system by employing inverters as envelope mixers. In the N stage RO with LC load, the injected signal (e.g., $V_{INJ1-4}$) is applied in voltage mode at each respective tap of the RO chain. The inverter supply is the input voltage that modulates the amplitude of the output square wave delivered to the respective LC load. It is noted that this structure exhibits no static power dissipation compared to the active mixer implementation shown in the circuit 140 (FIG. 11A). FIG. 14B illustrates the phasors operating in the circuit 220. The injected voltage signal interacts with the RO voltage signal to introduce a phase shift that manipulates the RO frequency according to the following expression.

$$\omega_{out} = f(V_{in}) = A \cdot (V_{in} + \sqrt{V_{in}^2 + B}) \quad (5)$$

where A and B are constants.

Figure 15:
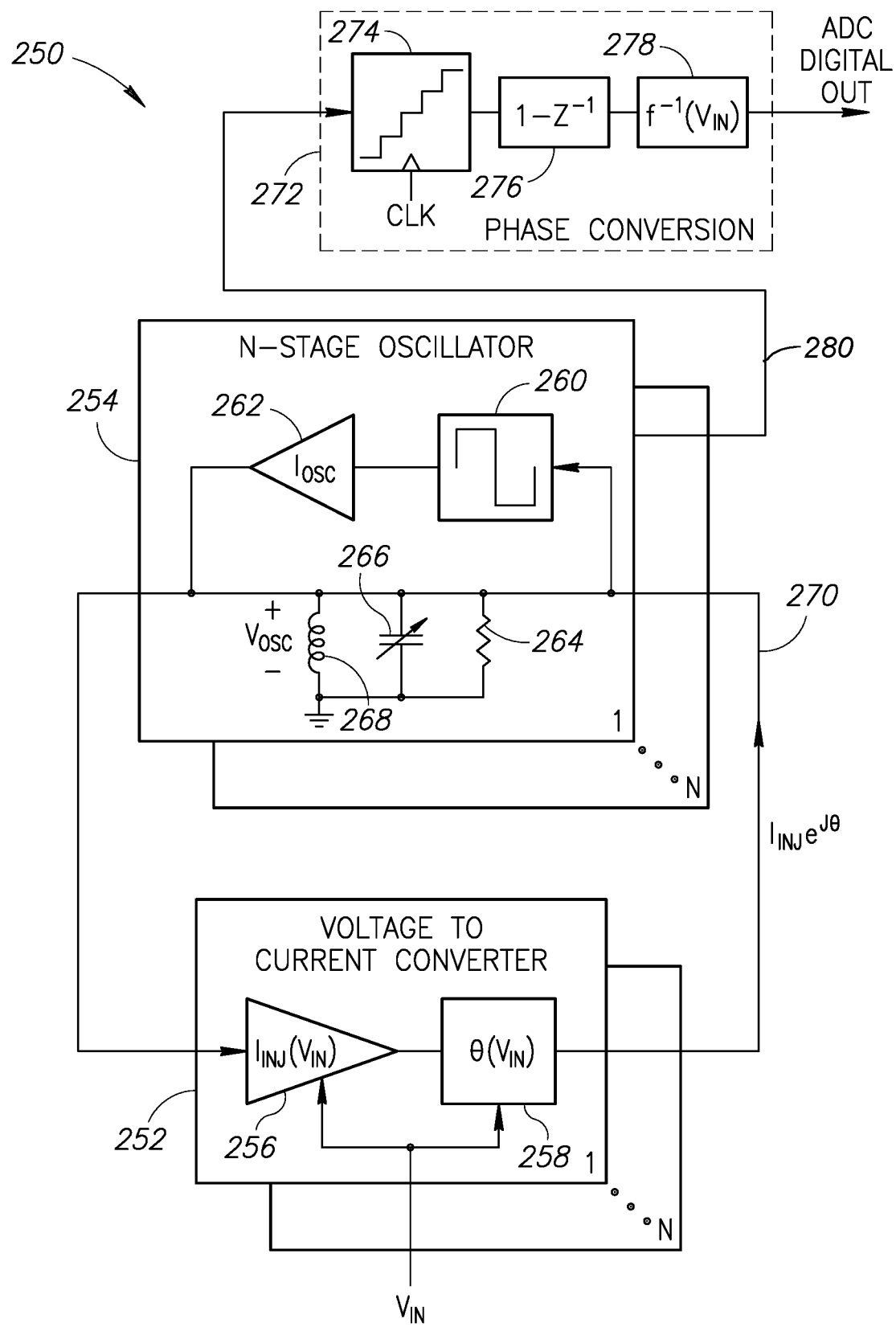
FIG. 15 is a block diagram illustrating a thirteenth example embodiment of a time mode analog to digital converter utilizing injection locking to improve linearity.

A block diagram illustrating a thirteenth example embodiment of a time mode analog to digital converter utilizing injection locking to improve linearity is shown in FIG. 15. The time mode ADC circuit, generally referenced 250, comprises a generic oscillator 254 (N-stage in general, but here N can be 1), and voltage to current converter block 252. The voltage to current converter block 252 is a modulator that resembles the mixer circuit described above. Each of the N≥1 oscillator stages 254 comprises an LC tank consisting of inductor 268, tunable capacitor 266 and equivalent parallel losses resistor 264, whose free-running frequency $\omega_o$ is controllably set by the capacitor 266. In operation, the tank is injected with a delayed version of its own resonating waveform.

The output of each N≥1 oscillator stage is coupled to a voltage-to-current converter 252 with amplitude and/or phase control, which acts as the modulator. Block 252 performs amplitude modulation ($I_{inj}$) 256 and/or phase modulation (θ) 258 on the oscillator signal $V_{osc}$. The modulation is a function of the input signal (e.g., input signal voltage) of the ADC $V_{in}$. In one embodiment, the output signal 270 is a current that is injected into the oscillator at a particular tap (or the lone resonator, if N=1). In operation, the circuit 250 performs tuning of the oscillator frequency, which is a function of $V_{in}$, using injection locking. The oscillator frequency is estimated by sampling the oscillator phase (signal 280) and differentiating it with respect to time. Note that oscillator phase output signal 280 can comprise a bus signal that connects to all stages in parallel or can tap any stage individually. This is achieved using a phase converter 272 including phase quantizer (or sampler) 274, phase differentiator 276, and (optional) look up table (LUT) 278. The LUT functions to generate the digital output in accordance with the frequency output from the differentiator. The LUT represents a mathematical relationship between the oscillator frequency and the input signal. It also essentially performs a mapping from the oscillator frequency to the digital output signal A graph illustrating the performance of a time mode analog to digital converter that does not employ injection locking is shown in FIG. 16. Although the frequency versus input voltage curve appears fairly linear, this is the case for a limited tuning range of frequencies and input voltage, i.e. approximately 300 MHz over an input voltage range from 0 to 0.7V.

Graphs illustrating the performance of the injection locked ADC circuit of FIG. 11A incorporating RC load based stages is shown in FIGS. 17A and 17B. These two graphs show a wider tuning range of approximately 700 MHz. A graph illustrating the magnitude and phase response of the injection locked ADC circuit of FIG. 11A incorporating RLC based stages is shown in FIG. 18. In this graph, the magnitude versus frequency is shown as the solid curve while the phase versus frequency curve is shown dashed. As shown, the linearity performance of the circuit 220 (FIG. 11A) is greatly improved with a significantly wider frequency tuning range.

Note that FIGS. 17A, 17B and 18 illustrate the relationship between the phase shift in the load circuit and frequency of the oscillator. In the ADC circuit of the present invention, the y-axis on these graphs labelled as 'phase' is the independent variable that is manipulated by the interaction of the oscillator and the injected signal and therefore serves the same purpose as the input voltage axis in the graph of FIG. 16.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

The embodiments were chosen and described in order to best explain the principles of the invention and the practical application, and to enable others of ordinary skill in the art to understand the invention for various embodiments with various modifications as are suited to the particular use contemplated.

The invention claimed is:

1. A time mode analog to digital converter (ADC) circuit, comprising:
   an oscillator operative to generate an oscillator signal;
   a modulator operative to generate a vector modulated signal in accordance with an input signal and said oscillator signal, wherein said vector modulated signal is injected back into said oscillator whose frequency of oscillation is determined by the input signal; and
   a phase converter operative to generate a digital output substantially proportional to said input signal in accordance with said oscillator signal.

2. The time mode ADC circuit according to claim 1, wherein said vector modulated signal comprises at least one of a phase modulated signal, and an amplitude modulated signal and at least one of a current signal, and a voltage signal.

3. The time mode ADC circuit according to claim 1, wherein said oscillator comprises at least one of an LC-tank based oscillator and an N-stage ring oscillator.

4. The time mode ADC circuit according to claim 1, wherein said oscillator comprises an N-stage ring oscillator, said vector modulated signal is injected back into at least one stage of said ring oscillator.

5. The time mode ADC circuit according to claim 1, wherein said phase converter comprises:
   a phase quantizer operative to generate a first digital signal in accordance with said oscillator signal;
   a digital differentiator operative to receive said first digital signal and generate a second digital signal representing a derivative thereof; and
   a lookup table (LUT) operative to generate the digital output in accordance with said second digital signal, wherein said LUT represents a mathematical relationship between said oscillator frequency and the input signal.

6. The time mode ADC circuit according to claim 1, wherein said phase converter comprises:
   a plurality of digital to time converters, each adapted to receive a clock signal; and
   a plurality of parallel phase samplers, each coupled to said oscillator and to a respective digital to time converter.

7. The time mode ADC circuit according to claim 1, further comprising scaling of an injection locking range (frequency modulation range) is determined by a stage of the oscillator selected for injection of said vector modulated signal.

8. The time mode ADC circuit according to claim 1, further comprising an injection phase selector circuit operative to select a stage of the oscillator for injection of said vector modulated signal in accordance with a digital control signal.

9. A method of time mode analog to digital conversion, the method comprising:
   providing an oscillator operative to generate an oscillator signal;
   modulating said oscillator signal in accordance with an input signal to generate a vector modulated signal;
   injecting said vector modulated signal back into said oscillator whose frequency of oscillation is determined by the input signal; and
   converting a phase of said oscillator signal to generate a digital output therefrom substantially proportional to said input signal.

10. The method according to claim 9, wherein said vector modulated signal comprises at least one of a phase modulated signal, and an amplitude modulated signal and at least one of a current signal, and a voltage signal.

11. The method according to claim 9, wherein said converting comprises:
   quantizing the phase of the oscillator signal to generate a first digital signal therefrom;
   differentiating the first digital signal to generate a second digital signal therefrom; and
   providing a lookup table (LUT) for generating the digital output in accordance with the second digital signal, wherein said LUT represents a mathematical relationship between said oscillator frequency and the input signal.

12. A time mode analog to digital converter (ADC) circuit, comprising:
   a free running N-stage ring oscillator, each stage comprising:
      a load circuit operative to generate a respective oscillator signal;
      a mixer coupled to the load circuit and operative to mix an input signal with an oscillator signal from a stage other than its own to generate a respective vector modulated signal therefrom;
   wherein the vector modulated signal in each stage is simultaneously injected into a respective load circuit thereof, wherein a frequency of oscillation of said oscillator is determined by the input signal;
   a phase converter operative to generate a digital output substantially proportional to said input signal in accordance with at least one of said oscillator signals; and
   wherein N is an integer greater than or equal to two.

13. The time mode ADC circuit according to claim 12, wherein said vector modulated signal comprises at least one of a phase modulated signal, and an amplitude modulated signal and at least one of a current signal, and a voltage signal.

14. The time mode ADC circuit according to claim 12, wherein said phase converter comprises a phase quantizer circuit comprising:
   a plurality of digital to time converters, each adapted to receive a clock signal; and
   a plurality of parallel phase samplers, each coupled to said ring oscillator and to a respective digital to time converter.

15. The time mode ADC circuit according to claim 14, wherein each phase sampler is gated by a delayed version of said clock signal.

16. The time mode ADC circuit according to claim 15, wherein a delay between clocks of said phase samplers is determined by a digital code input to said digital to time converters.

17. The time mode ADC circuit according to claim 12, wherein the mixer in each stage comprises a power efficient inverter based mixer whose supply is coupled to the input signal and whose input is coupled to a respective oscillator signal.

18. The time mode ADC circuit according to claim 12, wherein said phase converter comprises:
   a phase quantizer circuit operative to generate a first digital signal in accordance with said oscillator signal;

a digital differentiator operative to receive said first digital signal and generate a second digital signal representing a derivative thereof;

a lookup table (LUT) operative to generate the digital output in accordance with said second digital signal, wherein said LUT represents a mathematical relationship between said oscillator frequency and the input signal.

19. A method of time mode analog to digital conversion, the method comprising:

providing a free running N-stage ring oscillator, each stage including a load circuit, said N-stage ring oscillator operative to generate a respective oscillator signal at each stage thereof;

at each stage of the ring oscillator, mixing an input signal with an oscillator signal from another stage to generate a respective vector modulated signal;

simultaneously injecting each respective vector modulated signal in each stage into its respective load circuit;

converting a phase of at least one of said oscillator signals and generating a digital output substantially proportional to said input signal in accordance therewith; and wherein N is an integer greater than or equal to two.

20. The method according to claim 19, wherein each said respective vector modulated signal comprises at least one of a phase modulated signal, and an amplitude modulated signal and at least one of a current signal, and a voltage signal.

21. The method according to claim 19, further comprising phase resolution being uniform across all stages of the ring oscillator.

22. The method according to claim 19, further comprising an angular displacement between the oscillator signal and each respective vector modulated signal which is varied to scale an injection locking range (frequency modulation range).

23. The method according to claim 19, wherein said mixing comprises providing an inverter based mixer whose supply is coupled to the input signal and whose input is coupled to a respective oscillator signal.

24. The method according to claim 19, wherein said converting comprises:

quantizing the phase of the oscillator signal to generating a first digital signal therefrom;

differentiating the first digital signal to generate a second digital signal therefrom; and providing a lookup table (LUT) for generating the digital output in accordance with the second digital signal, wherein said LUT represents a mathematical relationship between said oscillator frequency and the input signal.

* * * * *